United States Patent
He et al.

(10) Patent No.: US 12,477,927 B2
(45) Date of Patent: Nov. 18, 2025

(54) DISPLAY SUBSTRATE, MANUFACTURING METHOD THEREOF, AND DISPLAY APPARATUS

(71) Applicant: BOE Technology Group Co., Ltd., Beijing (CN)

(72) Inventors: Jiayu He, Beijing (CN); Ce Ning, Beijing (CN); Zhengliang Li, Beijing (CN); Hehe Hu, Beijing (CN); Jie Huang, Beijing (CN); Nianqi Yao, Beijing (CN); Kun Zhao, Beijing (CN); Feifei Li, Beijing (CN); Liping Lei, Beijing (CN); Qi Qi, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 50 days.

(21) Appl. No.: 17/795,243

(22) PCT Filed: Sep. 30, 2021

(86) PCT No.: PCT/CN2021/122271
§ 371 (c)(1),
(2) Date: Jul. 26, 2022

(87) PCT Pub. No.: WO2023/050347
PCT Pub. Date: Apr. 6, 2023

(65) Prior Publication Data
US 2024/0188373 A1    Jun. 6, 2024

(51) Int. Cl.
*H10K 59/65* (2023.01)
*H10K 59/12* (2023.01)
(Continued)

(52) U.S. Cl.
CPC ......... *H10K 59/65* (2023.02); *H10K 59/1201* (2023.02); *H10K 59/1213* (2023.02); *H10K 59/874* (2023.02); *H10K 71/00* (2023.02)

(58) Field of Classification Search
CPC ...................................................... H10K 59/65
See application file for complete search history.

(56) References Cited

U.S. PATENT DOCUMENTS

| 2018/0323243 A1 | 11/2018 | Wang et al. |
| 2020/0044004 A1 | 2/2020 | Wang et al. |

(Continued)

FOREIGN PATENT DOCUMENTS

| CN | 109065582 A | 12/2018 |
| CN | 109786470 A | 5/2019 |

(Continued)

*Primary Examiner* — Douglas M Menz
(74) *Attorney, Agent, or Firm* — Ling Wu; Stephen Yang; Ling and Yang Intellectual Property

(57) ABSTRACT

Provided is a display substrate including a substrate and a plurality of light emitting units and a plurality of light detection units located on the substrate, At least one light emitting unit includes a light emitting element and a pixel circuit connected to the light emitting element, and at least one light detection unit includes an optical sensing element and a light emitting detecting circuit connected to the optical sensing element. At least one inorganic hydrogen barrier layer is arranged on one side of the optical sensing element close to the substrate. The light emitting element has a first light emitting region and a second light emitting region, the first light emitting region of the light emitting element emits light from a side away from the substrate, and the second light emitting region of the light emitting element emits light from a side close to the substrate.

20 Claims, 23 Drawing Sheets

(51) Int. Cl.
*H10K 59/121* (2023.01)
*H10K 59/80* (2023.01)
*H10K 71/00* (2023.01)

(56) References Cited

U.S. PATENT DOCUMENTS

| | | | |
|---|---|---|---|
| 2020/0161583 | A1 | 5/2020 | Paek et al. |
| 2021/0020709 | A1* | 1/2021 | Yang .................... H10K 50/865 |
| 2021/0167143 | A1 | 6/2021 | He et al. |
| 2021/0217784 | A1 | 7/2021 | Li et al. |
| 2022/0005888 | A1 | 1/2022 | Wang et al. |
| 2022/0359635 | A1 | 11/2022 | Han et al. |

FOREIGN PATENT DOCUMENTS

| | | |
|---|---|---|
| CN | 110972507 A | 4/2020 |
| CN | 110993616 A | 4/2020 |
| CN | 111200081 A | 5/2020 |
| CN | 111370458 A | 7/2020 |
| CN | 111509014 A | 8/2020 |
| CN | 112467052 A | 3/2021 |
| CN | 113053965 A | 6/2021 |

\* cited by examiner

DISPLAY SUBSTRATE, MANUFACTURING METHOD THEREOF, AND DISPLAY APPARATUS

CROSS-REFERENCE TO RELATED APPLICATION

The present application is a U.S. National Phase Entry of International Application No. PCT/CN2021/122271 having an international filing date of Sep. 30, 2021. The above-identified application is hereby incorporated by reference.

TECHNICAL FIELD

Embodiments of the present disclosure relate to, but are not limited to, the field of display technology, in particular to a display substrate and a preparation method therefor, and a display apparatus.

BACKGROUND

An organic light emitting diode (OLED) display has advantages such as low energy consumption, self-luminescence, good temperature characteristics, high response speed, flexibility, ultra-thinness and low cost. The OLED has been widely used in display fields, including mobile phones, tablet computers, digital cameras and so on, attracting growing attention.

SUMMARY

The following is a summary of subject matters described herein in detail. The summary is not intended to limit the protection scope of claims.

Embodiments of the present disclosure provide a display substrate, a preparation method thereof, and a display apparatus.

In one aspect, embodiments of the present disclosure provide a display substrate including a substrate and a plurality of light emitting units and a plurality of light detection units located on the substrate. At least one light emitting unit of the plurality of light emitting units includes a light emitting element and a pixel circuit connected to the light emitting element, and at least one light detection unit of the plurality of light detection units includes an optical sensing element and a light emitting detecting circuit connected to the optical sensing element. The optical sensing element is located on one side of the light emitting element close to the substrate; at least one inorganic hydrogen barrier layer is arranged on a side of the optical sensing element close to the substrate. The light emitting element includes a first light emitting region and a second light emitting region, the first light emitting region of the light emitting element emits light from a side away from the substrate, and the second light emitting region of the light emitting element emits light from a side close to the substrate; an orthographic projection of the second light emitting region of the light emitting element on the substrate completely falls within an orthographic projection of the first light emitting region on the substrate. An orthographic projection of at least one of the optical sensing elements on the substrate at least partially overlaps an orthographic projection of a second light emitting region of at least one of the light emitting elements on the substrate.

In some exemplary embodiments, the optical sensing element includes: a first cathode, a photoelectric conversion structure and a first anode that are sequentially stacked along a direction away from the substrate; the first anode is made of a light-transmissive material. The at least one inorganic hydrogen barrier layer is located on a side of the photoelectric conversion structure close to the substrate.

In some exemplary embodiments, in a direction perpendicular to the display substrate, the light emission detection circuit at least includes: a semiconductor layer, a gate metal layer, and a first source-drain metal layer sequentially disposed on the substrate. The first cathode of the optical sensing element and the first source-drain metal layer are in the same layer. The inorganic hydrogen barrier layer at least includes one of the following: an interlayer insulating layer located between the gate metal layer and the first source-drain metal layer, and a second passivation layer located on a side of the first source-drain metal layer away from the substrate.

In some exemplary embodiments, an orthographic projection of the second passivation layer on the substrate does not overlap an orthographic projection of the photoelectric conversion structure on the substrate.

In some exemplary embodiments, the second passivation layer includes a first inorganic layer and a second inorganic layer that are stacked, and the thicknesses of the first inorganic layer and the second inorganic layer are substantially the same.

In some exemplary embodiments, the thickness of the first inorganic layer and the second inorganic layer is 1000 angstroms to 3000 angstroms, and the material of the first inorganic layer and the second inorganic layer is silicon oxide.

In some exemplary embodiments, in a direction perpendicular to the display substrate, the light emission detection circuit at least includes: a semiconductor layer, a gate metal layer, and a first source-drain metal layer sequentially disposed on the substrate. The first cathode of the optical sensing element is located on a side of the first source-drain metal layer away from the substrate. The inorganic hydrogen barrier layer at least includes one of the following: an interlayer insulating layer between the gate metal layer and the first source-drain metal layer, a third passivation layer between the first source-drain metal layer and the first cathode of the optical sensing element, and a fourth passivation layer between the third passivation layer and the first cathode of the optical sensing element.

In some exemplary embodiments, the material of the third passivation layer and the fourth passivation layer is silicon oxide, and the thickness of the third passivation layer and the fourth passivation layer is 1000 angstroms to 3000 angstroms.

In some exemplary embodiments, an organic hydrogen barrier layer is provided between the fourth passivation layer and a first cathode of the optical sensing element. An orthographic projection of the organic hydrogen barrier layer on the substrate covers an orthographic projection of the photoelectric conversion structure of the optical sensing element on the substrate; the organic hydrogen barrier layer satisfies at least one of the following: the curing temperature is lower than 230 degrees Celsius; the thermal decomposition temperature is greater than 450 degrees Celsius.

In some exemplary embodiments, the etching rate of the interlayer insulating layer is 2 Å/s.

In some exemplary embodiments, the light emission detection circuit at least includes one transistor. An orthographic projection of the photoelectric conversion structure on the substrate does not overlap an orthographic projection of the transistor of the light emission detection circuit on the substrate.

In some exemplary embodiments, the photoelectric conversion structure includes a first photoelectric conversion structure and a second photoelectric conversion structure arranged in sequence along a first direction, and an orthographic projection of the transistor of the light emission detection circuit on the substrate is positioned between an orthographic projection of the first photoelectric conversion structure and an orthographic projection of the second photoelectric conversion structure on the substrate.

In some exemplary embodiments, the orthographic projections of the first photoelectric conversion structure and the second photoelectric conversion structure on the substrate are rectangular.

In some exemplary embodiments, the light emitting element includes: a second anode, an emitting functional layer, and a second cathode that are sequentially stacked in a direction away from the substrate. The second cathode is made of light-transmissive material. The second anode includes a reflective layer and a light-transmissive layer which are stacked; an orthographic projection of the reflective layer on the substrate does not overlap an orthographic projection of the second light emitting region on the substrate, and an orthographic projection of the light-transmissive layer on the substrate covers the orthographic projection of the second light emitting region on the substrate.

In some exemplary embodiments, an orthographic projection of the optical sensing element on the substrate at least partially overlaps an orthographic projection of the light emission detection circuit on the substrate, and the orthographic projection of the optical sensing element on the substrate does not overlap with an orthographic projection of the pixel circuit on the substrate.

In some exemplary embodiments, an orthographic projection of at least one optical sensing element on the substrate at least partially overlaps the orthographic projections of the second light emitting regions of eight light emitting elements on the substrate.

In another aspect, an embodiment of the present disclosure provides a display apparatus, which includes the aforementioned display substrate.

In another aspect, the embodiment of the present disclosure provides a preparation method for a display substrate, including: forming a circuit structure layer and at least one inorganic hydrogen barrier layer on a substrate, wherein the circuit structure layer at least includes a pixel circuit of a light emitting unit and a light emission detection circuit of a light detection unit; forming an optical sensing element of a light detection unit on a side of the circuit structure layer away from the substrate; and forming a light emitting element of the light emitting unit on a side of the optical sensing element away from the substrate. Wherein, the light emitting element includes a first light emitting region and a second light emitting region, the first light emitting region of the light emitting element emits light from a side away from the substrate, and the second light emitting region of the light emitting element emits light from a side close to the substrate; an orthographic projection of the first light emitting region of the light emitting element on the substrate includes an orthographic projection of the second light emitting region on the substrate, and an orthographic projection of at least one optical sensing element on the substrate at least partially overlaps an orthographic projection of the second light emitting region of the at least one light emitting element on the substrate.

In some exemplary embodiments, the circuit structure layer includes: a semiconductor layer, a gate metal layer, and a first source-drain metal layer sequentially disposed on the substrate. The first cathode of the optical sensing element and the first source-drain metal layer are in the same layer. The inorganic hydrogen barrier layer at least includes one of the following: an interlayer insulating layer located between the gate metal layer and the first source-drain metal layer, and a second passivation layer located on a side of the first source-drain metal layer away from the substrate. Alternatively, the first cathode of the optical sensing element is located on a side of the first source-drain metal layer away from the substrate; The inorganic hydrogen barrier layer at least includes one of the following: an interlayer insulating layer between the gate metal layer and the first source-drain metal layer, a third passivation layer between the first source-drain metal layer and the first cathode of the optical sensing element, and a fourth passivation layer between the third passivation layer and the first cathode of the optical sensing element.

In some exemplary embodiments, the forming of at least one inorganic hydrogen barrier layer on the substrate includes: forming a second passivation layer by deposition, wherein the second passivation layer includes a first inorganic layer and a second inorganic layer which are stacked. The deposition mode of the first inorganic layer satisfies the following conditions: the deposition power is 500 watts to 1000 watts; the deposition pressure is 1000 mTorr to 2000 mTorr; and the gas flow ratio of SiH to $N_2O$ is 1:30 to 1:50. The deposition mode of the second inorganic layer satisfies the following conditions: the deposition power is 1000 watts to 2000 watts; the deposition pressure is 1000 mTorr to 2000 mTorr; and the gas flow ratio of SiH to $N_2O$ is from 1:30 to 1:50.

In some exemplary embodiments, the forming of at least one inorganic hydrogen barrier layer on the substrate includes: forming a third passivation layer by deposition. The deposition mode of the third passivation layer satisfies the following conditions: the deposition power is 500 watts to 1000 watts; the deposition pressure is 1000 mTorr to 2000 mTorr; and the gas flow ratio of SiH to $N_2O$ is from 1:30 to 1:50.

After reading and understanding the drawings and the detailed description, other aspects may be understood.

BRIEF DESCRIPTION OF DRAWINGS

The accompanying drawings are used for providing understanding for technical solutions of the present disclosure, and form a part of the specification. They are used for explaining the technical solutions of the present disclosure together with the embodiments of the present disclosure, and do not form a limitation on the technical solutions of the present disclosure.

DETAILED DESCRIPTION

Figure 1:
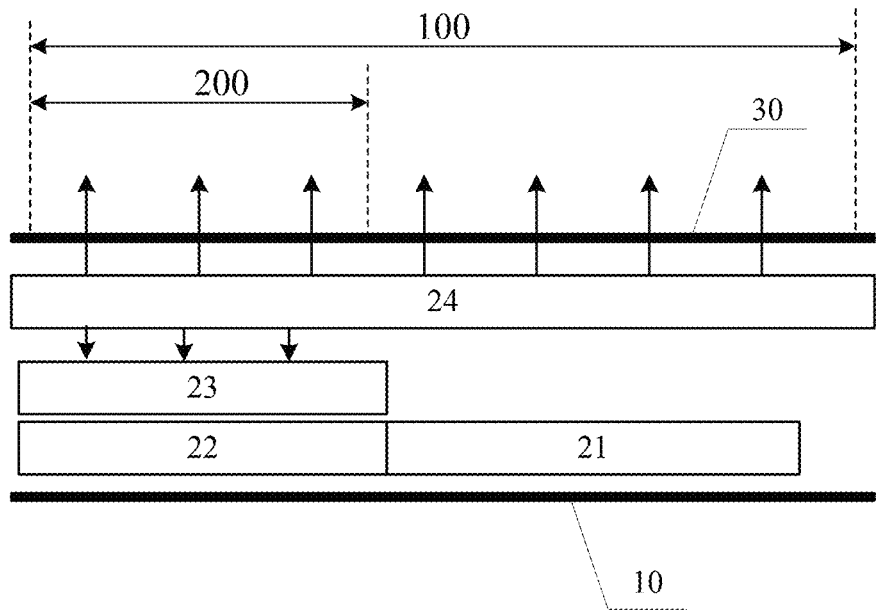
FIG. 1 is a schematic diagram of a structure of a display substrate according to at least one embodiment of the present disclosure.

The embodiments of the present disclosure will be described below in combination with the drawings in detail. Implementation modes may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one embodiment of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, term "a plurality of" represents two or more than two.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements can be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with a certain electrical effect. The "element having some electrical function" is not particularly limited as long as electrical signals between the connected constituent elements may be transmitted. Examples of the "element having some electrical function" not only include an electrode and a wiring, but also include a switch element such as a transistor, a resistor, an inductor, a capacitor, another element with a plurality of functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchangeable in the specification.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the present disclosure, "film" and "layer" are interchangeable. For example, a "conductive layer" may be replaced with a "conductive film" sometimes. Similarly, an "insulating film" may be replaced with an "insulating layer" sometimes.

In the specification, "about" refers to a case that a boundary is defined not so strictly and a process and measurement error within a range is allowed.

OLED brightness compensation methods may be categorized into electrical compensation and optical compensation. Electrical compensation may compensate for the threshold voltage and mobility changes, while optical compensation may compensate for more factors causing uneven brightness without distinguishing the causes of brightness changes. In an optical compensation mode, a light emission detection circuit may detect the brightness signal of an OLED device through an optical sensing element to compensate the brightness of the OLED device according to the brightness signal. Taking the optical sensing element being PIN photodiode as an example, in the existing preparation process, the gas atmosphere of each film layer for preparing PIN photodiode is mainly silicon tetrahydride (SiH4) and hydrogen (H2). Therefore, when the substrate is exposed to hydrogen atmosphere for a long time, hydrogen can easily penetrate into the oxide active layer of Thin Film Transistor (TFT), which makes the oxide active layer conductive, and the conductive oxide active layer will make TFT in a state of high current, which will affect the electrical properties of TFT.

An embodiment of the present disclosure provides a display substrate, which includes a substrate and a plurality of light emitting units and a plurality of light detection units located on the substrate, At least one light emitting unit includes: a light emitting element and a pixel circuit connected to the light emitting element, At least one light detection unit includes: an optical sensing element and a light emission detection circuit connected to the optical sensing element. The optical sensing element is located on a side of the light emitting element close to the substrate. At least one inorganic hydrogen barrier layer is arranged on a side of the optical sensing element close to the substrate. The light emitting element has a first light emitting region and a second light emitting region. The first light emitting region of the light emitting element emits light from a side away from the substrate, and the second light emitting region of the light emitting element emits light from a side close to the substrate. An orthographic projection of the second light emitting region of the light emitting element on the substrate completely falls within an orthographic projection of the first light emitting region on the substrate. An orthographic projection of at least one optical sensing element on the substrate at least partially overlaps an orthographic projection of the second light emitting region of the at least one light emitting element on the substrate.

Embodiments of the present disclosure achieve optical compensation by designing a display substrate with a top emission structure. In addition, an inorganic hydrogen barrier layer is arranged on the side of the optical sensing element close to the substrate, so as to block hydrogen in the preparation process of the optical sensing element, reduce the penetration of hydrogen elements into the transistor, and ensure the normal electrical characteristics of the transistor, thereby improving the yield of the display substrate and improving the display effect.

FIG. 1 is a schematic diagram of a structure of a display substrate according to at least one embodiment of the present disclosure. In some exemplary embodiments, as shown in FIG. 1, the pixel circuit 21 and the light emission detection circuit 22 are disposed on the substrate 10, and the optical sensing element 23 is located on a side of the pixel circuit 21 and the light emission detection circuit 22 away from the substrate 10. An orthographic projection of the optical sensing element 23 on the substrate 10 overlaps with an orthographic projection of the light emission detection circuit 22 on the substrate 10. The light emitting element 24 is located on a side of the optical sensing element 23 away from the substrate 10. The cover plate 30 is located on a side of the light emitting element 24 away from the substrate 10.

An orthographic projection of the light emitting element 24 on the substrate 10 overlaps with an orthographic projection of the optical sensing element 23 on the substrate 10.

As shown in FIG. 1, the light emitting element 24 may have a first light emitting region 100 and a second light emitting region 200. The first light emitting region 100 of the light emitting element 24 emits light from a side away from the substrate 10 and the second light emitting region 200 of the light emitting element 24 emits light from a side close to the substrate 10. The orthographic projection of the second light emitting region 200 of the light emitting element 24 on the substrate 10 completely falls within the orthographic projection of the first light emitting region 100 on the substrate 10. That is, the light emitting element 24 may emit light on both sides. The orthographic projection of the optical sensing element 23 on the substrate 10 at least partially overlaps the orthographic projection of the second light emitting region of the light emitting element 24 on the substrate 10. In some embodiments, the light emitting element 24 corresponds to a region of the optical sensing element 23, that is, the light emitting element 24 may be configured to emit light on both sides at a part where the first light emitting region 100 and the second light emitting region 200 of the light emitting element 24 overlap. In this way, the optical sensing element 23 located on the side of the light emitting element 24 close to the substrate 10 can receive the light emitted by the light emitting element 24. The light emission detection circuit 22 can detect the luminance signal of the light emitting element 24 through the optical sensing element 23, so as to perform luminance compensation on the light emitting element 24 according to the luminance signal.

In this exemplary embodiment, as shown in FIG. 1, a first light emitting region of the light emitting element 24 emits light upward (i.e., emits light from a side away from the substrate 10) to achieve display; and a part of the light emitted downward by a second light emitting region of the light emitting element 24 (i.e., the side facing the substrate 10) may be provided to an optical sensing element 23 so that the optical sensing element 23 may detect the 1 uminous brightness, and the rest of the light may be directly reflected back to the upper surface of the light emitting element 24 for display.

Figure 2:
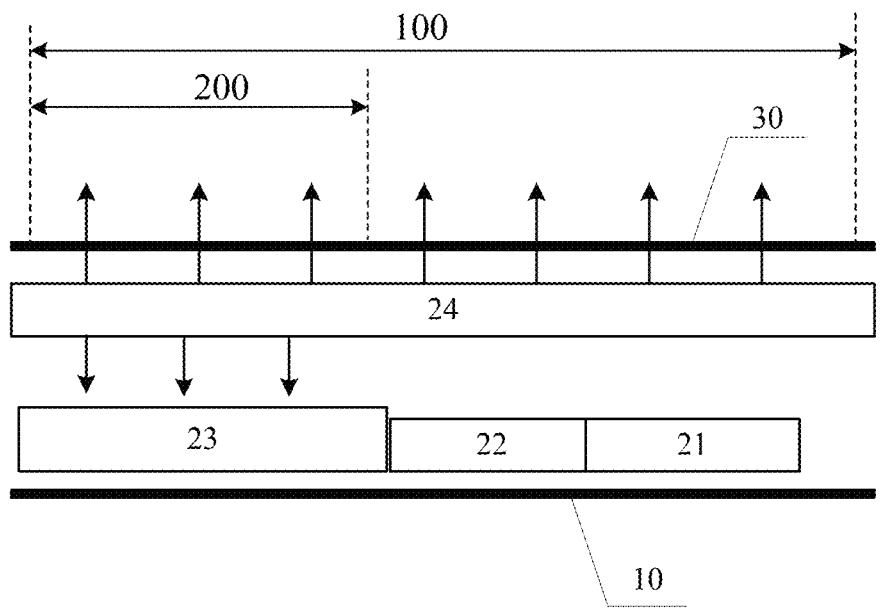
FIG. 2 is a schematic diagram of another structure of a display substrate according to at least one embodiment of the present disclosure.

FIG. 2 is schematic diagram of another structure of a display substrate according to at least one embodiment of the present disclosure. In some exemplary embodiments, as shown in FIG. 2, the pixel circuit 21 and the light emission detection circuit 22 are disposed on the substrate 10. An orthographic projection of the optical sensing element 23 on the substrate 10 does not have to overlap the orthographic projections of the light emission detection circuit 22 and the pixel circuit 21 on the substrate 10. The light emitting element 24 is located on the side of the optical sensing element 24 away from the substrate 10 and the cover plate 30 is located on the side of the light emitting element 24 away from the substrate 10. In this example, the light emitting element 24 has a first light emitting region 100 and a second light emitting region 200, and the light emitting element 24 may be configured to emit light on both sides at a part thereof where the first light emitting region 100 and the second light emitting region 200 overlap. For the rest of the structure of the display substrate of this embodiment, reference may be made to descriptions of the aforementioned embodiments, and thus will not be repeated here.

The display substrate provided by the embodiment adopts a top emission structure and is provided with a light emitting element emitting on both sides to achieve optical compensation, which is not only helpful to improve the pixel aperture ratio and resolution, but also can support better display effect.

In some exemplary embodiments, the optical sensing element may include: a first cathode, a photoelectric conversion structure, and a first anode that are sequentially stacked in a direction away from the substrate. The first anode may be made of a light-transmissive material, and the first cathode may be made of a light-shielding material. At least one inorganic hydrogen barrier layer may be located on a side of the photoelectric conversion structure close to the substrate. In some examples, an optical sensing element may be a PIN type photodiode. The photoelectric conversion structure may include a stacked first doped layer, an intrinsic layer, and a second doped layer. However, this embodiment is not limited thereto.

In some exemplary embodiments, in a direction perpendicular to the display substrate, the light emission detection circuit at least includes a semiconductor layer, a gate metal layer, and a first source-drain metal layer that are sequentially disposed on the substrate. The first cathode of the optical sensing element and the first source-drain metal layer are in the same layer structure. The inorganic hydrogen barrier layer may at least includes one of the following: an interlayer insulating layer located between the gate metal layer and the first source-drain metal layer, and a second passivation layer located on a side of the first source-drain metal layer away from the substrate. For example, the inorganic hydrogen barrier layer may include an interlayer insulating layer or a second passivation layer or both of the interlayer insulating layer and the second passivation layer. However, this embodiment is not limited thereto.

In some exemplary embodiments, the orthographic projection of the second passivation layer on the substrate does not overlap with the orthographic projection of the photoelectric conversion structure on the substrate. The photoelectric conversion structure is formed after the second passivation layer is prepared.

In some exemplary embodiments, in a direction perpendicular to the display substrate, the light emission detection circuit at least includes: a semiconductor layer, a gate metal layer, and a first source-drain metal layer sequentially disposed on the substrate. The first cathode of the optical sensing element is located on a side of the first source-drain metal layer away from the substrate. The inorganic hydrogen barrier layer may at least includes one of the following: an interlayer insulating layer between the gate metal layer and the first source-drain metal layer, a third passivation layer between the first source-drain metal layer and the first cathode of the optical sensing element, and a fourth passivation layer between the third passivation layer and the first cathode of the optical sensing element. For example, the inorganic hydrogen barrier layer may include an interlayer insulating layer, a third passivation layer, and a fourth passivation layer. Or, it includes a third passivation layer and a fourth passivation layer; or includes a fourth passivation layer; alternatively, a third passivation layer is included. However, this embodiment is not limited thereto.

In some exemplary embodiments, an organic hydrogen barrier layer is provided between the fourth passivation layer and a first cathode of the optical sensing element. The orthographic projection of the organic hydrogen barrier layer on the substrate covers the orthographic projection of the photoelectric conversion structure of the optical sensing element on the substrate. The organic hydrogen barrier layer satisfies at least one of the following: the curing temperature is lower than 230 degrees Celsius; the thermal decomposition temperature is greater than 450 degrees Celsius. In this example, hydrogen blocking in the preparation process of the optical sensing element is achieved by providing an inorganic hydrogen barrier layer and an organic hydrogen barrier layer.

In some exemplary implementations, the pixel circuit may have a structure of 3T1C, 4T1C, 5T1C, 5T2C, 6T1C, or 7T1C. The light emission detection circuit may be designed as 1T1C. However, this embodiment is not limited thereto.

Figure 3:
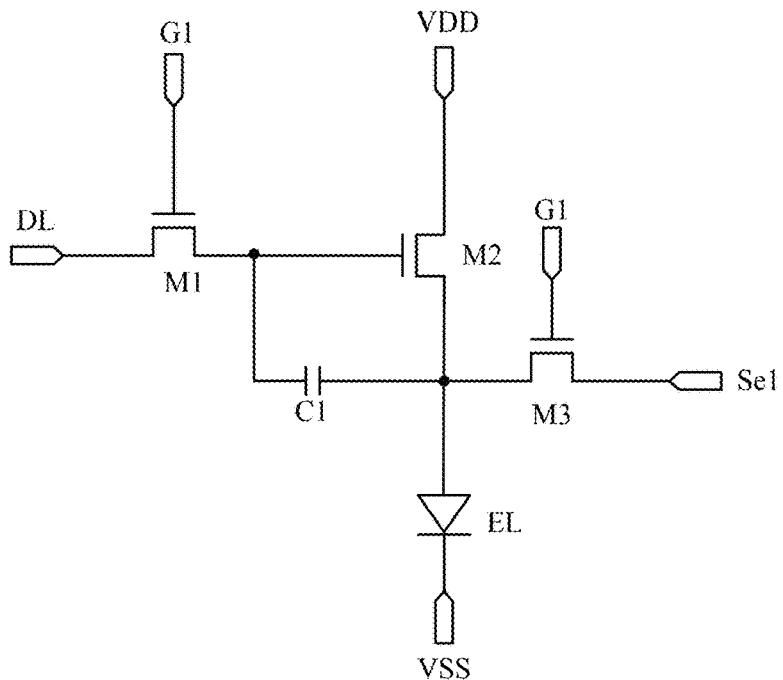
FIG. 3 is an equivalent circuit diagram of a pixel circuit according to at least one embodiment of the present disclosure.

FIG. 3 is an equivalent circuit diagram of a pixel circuit according to at least one embodiment of the present disclosure. In the present exemplary embodiment, the pixel circuit may adopt a 3T1C design. As shown in FIG. 3, a pixel circuit according to an exemplary embodiment may include: a first transistor M1, a second transistor M2, a third transistor M3, and a first storage capacitor C1. In this example, the first transistor M1 may be a switch transistor, the second transistor M2 may be a drive transistor, and the third transistor M3 may be a compensation transistor.

As shown in FIG. 3, the control electrode of the first transistor M1 is electrically connected to the first scan line G1, the first electrode of the first transistor M1 is electrically connected to the data line DL, and the second electrode of the first transistor M1 is electrically connected to the control electrode of the second transistor M2. The first electrode of the second transistor M2 is electrically connected to the first power supply line VDD, and the second electrode of the second transistor M2 is electrically connected to the second electrode of the third transistor M3. The control electrode of the third transistor M3 is electrically connected to the first scan line G1, and the first electrode of the third transistor M3 is electrically connected to the compensation line Se1. The first electrode of the first storage capacitor C1 is electrically connected to the control electrode of the second transistor M2, and the second electrode of the first storage capacitor C1 is electrically connected to the second electrode of the second transistor M2. The first electrode (anode) of the light emitting element EL is electrically connected to a second electrode of the second transistor M2, and the second electrode (cathode) of the light emitting element EL is electrically connected to a second power supply line VSS.

In some exemplary implementation modes, the first power line VDD may keep providing high-level signals, and the second power line VSS may keep providing low-level signals. The first transistor M1 to the third transistor M3 may be P-type transistors or may be N-type transistors. However, this embodiment is not limited thereto.

Figure 4:
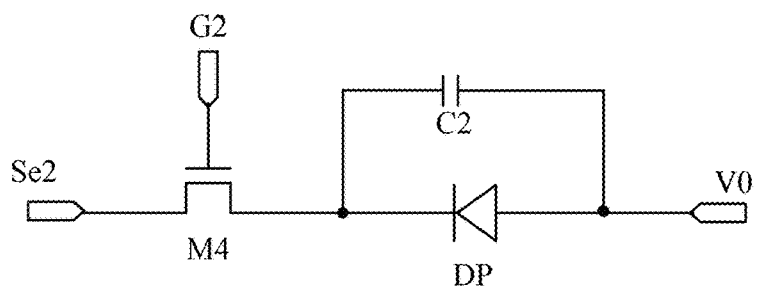
FIG. 4 is an equivalent circuit diagram of a light emission detection circuit according to at least one embodiment of the present disclosure.

FIG. 4 is an equivalent circuit diagram of a light emission detection circuit according to at least one embodiment of the present disclosure. In some exemplary embodiments, as shown in FIG. 4, the light emission detection circuit may include: a fourth transistor M4 and a second storage capacitor C2. The control electrode of the fourth transistor M4 is electrically connected to the second scan line G2, the first electrode of the fourth transistor M4 is electrically connected to the sensing line Se2, and the second electrode of the fourth transistor M4 is electrically connected to the second electrode (cathode) of the optical sensing element DP. The first electrode of the second storage capacitor C2 is electrically connected to the second electrode of the optical sensing element DP, and the second electrode of the second storage capacitor C2 is electrically connected to the first electrode (anode) of the optical sensing element DP. The second storage capacitor C2 is configured to store the electrical signal converted by the optical sensing element DP. The anode of the optical sensing element DP is electrically connected to the reference voltage line V0. In the present example, the optical sensing element DP may be a PIN type photodiode. However, no limits are made thereto in the present disclosure.

Figure 5:
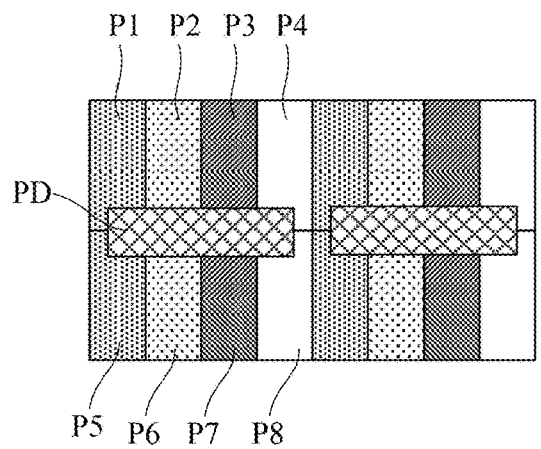
FIG. 5 is a schematic diagram of an arrangement of a light emitting unit and a light detection unit according to at least one embodiment of the present disclosure.

FIG. 5 is a schematic diagram of an arrangement of a light emitting unit and a light detection unit according to at least one embodiment of the present disclosure. In some exemplary embodiments, as shown in FIG. 5, the display substrate includes a plurality of pixel units arranged regularly. A pixel unit may include four light emitting units emitting light rays of different colors. For example, a pixel unit can include: a first light emitting unit P1 emits light of the first color, a second light emitting unit P2 emits light of the second color, a third light emitting unit P3 emits light of the third color, and a fourth light emitting unit P4 emits light of the fourth color. The pixel unit includes four light emitting units which can be arranged in a horizontal parallel manner, and the light emitting units which emit light of the same color are located in the same column. For example, the first light emitting unit P1 and the fifth light emitting unit P5 both emit red light, the second light emitting unit P2 and the sixth light emitting unit P6 both emit green light, the third light emitting unit P3 and the seventh light emitting unit P7 both emit blue light, and the fourth light emitting unit P4 and the eighth light emitting unit P8 both emit white light. However, this embodiment is not limited thereto.

In some exemplary embodiments as shown in FIG. 5, the eight light emitting units arranged in an array (i.e. the first light emitting unit P1 to the eighth light emitting unit P8) may be multiplexed with one light detection unit PD. An orthographic projection of the optical sensing element of the light detection unit PD on the substrate is overlapped with an orthographic projection of the second light emitting region of the light emitting elements of the eight light emitting units on the substrate, so as to achieve luminance detection of the eight light emitting elements.

In some exemplary embodiments, as shown in FIG. 5, the light detection unit PD is configured to detect light emitted by eight light emitting units (i.e., the first light emitting unit P1 to the eighth light emitting unit P8), thereby achieving luminance detection and compensation for a single light emitting unit. In some examples, for eight light emitting units (i.e. the first light emitting unit P1 to the eighth light emitting unit P8), the luminance value of a single light emitting unit may be obtained by eight luminance detection processes. In the process of eight luminance detections, seven of the eight light emitting units are lit at a time, and the single light emitting unit is turned off only in one luminance detection process in the eight luminance detection process (that is, the single light emitting unit is lit seven times in the eight luminance detection process, but only not lit once), and the light detection unit can obtain a sensed luminance value through a single luminance detection, and then using the eight sensed luminance values detected by the light detection unit, the luminance value of a single light emitting unit can be calculated. Taking the example where the luminance value of the first light emitting unit is a1, The luminance value of the second light emitting unit is a2, the luminance value of the third light emitting unit is a3, the luminance value of the fourth light emitting unit is a4, the luminance value of the fifth light emitting unit is a5, the luminance value of the sixth light emitting unit is a6, the luminance value of the seventh light emitting unit is a7, and the luminance value of the eighth light emitting unit is a8, the following formula can be obtained by eight times of luminance detection:

$$a1+a2+a3+a4+a5+a6+a7=b1;$$

$$a1+a2+a3+a4+a5+a6+a8=b2;$$

$$a1+a2+a3+a4+a5+a7+a8=b3;$$

$$a1+a2+a3+a4+a6+a7+a8=b4;$$

$$a1+a2+a3+a5+a6+a7+a8=b5;$$

$$a1+a2+a4+a5+a6+a7+a8=b6;$$

$$a1+a3+a4+a5+a6+a7+a8=b7;$$

$$a2+a3+a4+a5+a6+a7+a8=b8.$$

Wherein, b1 to b8 are sensed luminance values detected by the light detection unit during eight luminance detection processes.

According to the above formula, the following may be calculated:

$$a1-((b1+b2+b3+b4+b5+b6+b7+b8)/8)-b8;$$

$$a2-((b1+b2+b3+b4+b5+b6+b7+b8)/8)-b7;$$

$$a3=((b1+b2+b3+b4+b5+b6+b7+b8)/8)-b6;$$

$$a4=((b1+b2+b3+b4+b5+b6+b7+b8)/8)-b5;$$

$$a5-((b1+b2+b3+b4+b5+b6+b7+b8)/8)-b4;$$

$$a6-((b1+b2+b3+b4+b5+b6+b7+b8)/8)-b3;$$

$$a7=((b1+b2+b3+b4+b5+b6+b7+b8)/8)-b2;$$

$$a8-((b1+b2+b3+b4+b5+b6+b7+b8)/8)-b1.$$

In this way, eight luminance detections are performed by one light detection unit, and the luminance values of each of the eight light emitting units can be obtained by the eight sensed luminance values obtained by the eight luminance detection processes, so as to compensate the luminance of the eight light emitting units respectively.

When the detection duration for each time when the light detection unit detects the luminance value of one light emitting unit is T, the total duration required for sequentially detecting the luminance values of eight light emitting units is 8T. By adopting the above detection method, the light detection unit can turn on two rows of light emitting units each detection, and the luminance value detected once is the total luminance value of seven light emitting units, so the duration required for eight times of detection is about (1/7) T*8*2=(16/7) T. It can be seen that, compared with the method of sequential detection by a single light emitting unit, the detection time required by the above detection method can be shortened by about 3.5 times, which can save the detection time and improve the optical sensing efficiency.

An example of the structure of the display substrate is described below by a cross-sectional view of the display substrate.

Figure 6:
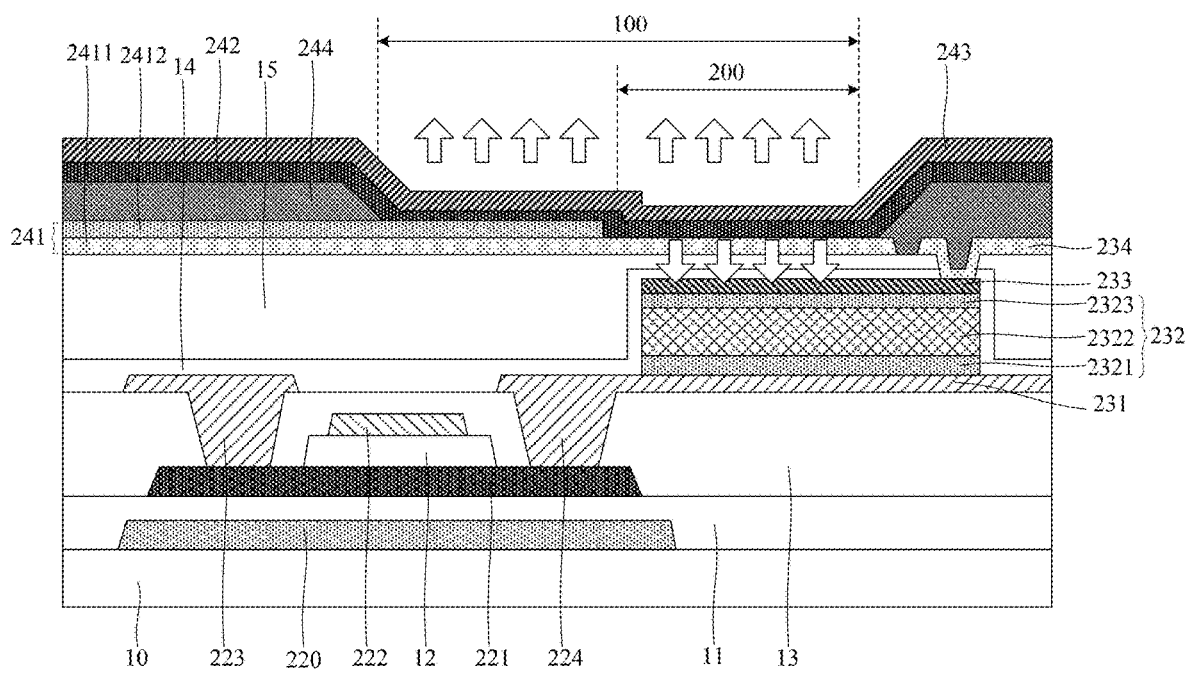
FIG. 6 is a partial schematic section view of a display substrate according to at least one embodiment of the present disclosure.

FIG. 6 is a partial schematic section view of a display substrate according to at least one embodiment of the present disclosure. In an exemplary embodiment, as shown in FIG. 6, in a direction perpendicular to the display substrate, The display substrate may include: a substrate 10, a circuit structure layer, a sensing structure layer, a first passivation layer 14, a first planarization layer 15 and an emitting structure layer sequentially arranged on the substrate 10. The circuit structure layer may include a plurality of pixel circuits and a plurality of light emission detection circuits. The sensing structure layer may include a plurality of optical sensing elements. The emitting structure layer may include a plurality of light emitting elements. In FIG. 6, only one light emitting element, one optical sensing element and one transistor of the light emission detection circuit are illustrated as examples. The first passivation layer 14 and the first planarization layer 15 may cover the circuit structure layer and the sensing structure layer. The first planarization layer 15 is located on the side of the first passivation layer 14 away from the substrate 10. The first passivation layer 14 may be an inorganic insulating layer and the first planarization layer 15 may be an organic insulating layer.

In some exemplary embodiments, as shown in FIG. 6, the circuit structure layer may include: a shield layer 220 disposed on a substrate 10, a first insulating layer 11 covering the shield layer 220, a semiconductor layer disposed on the side of the first insulating layer 11 away from the substrate 10, a second insulating layer 12 disposed on the side of the semiconductor layer away from the substrate 10, a gate metal layer disposed on the side of the second insulating layer 12 away from the substrate 10, a third insulating layer 13 covering the gate metal layer, and a first source-drain metal layer disposed on the side of the third insulating layer 13 away from the substrate 10. The semiconductor layer at least includes an active layer 221. The gate metal layer at least includes a gate electrode 222. The first source-drain metal layer at least includes a source electrode 223 and a drain electrode 224. In this example, the active layer 221 the gate electrode 222 the source electrode 223 and the drain electrode 224 may form one transistor which may be, for example, a fourth transistor M4 in the light emission detection circuit. In some examples, the first insulating layer 11 may also be referred to as a buffer layer, the second insulating layer 12 may also be referred to as a gate insulating layer, and the third insulating layer 13 may also be referred to as an interlayer insulating layer. The first to third insulating layers 11 to 13 may be inorganic insulating layers.

In some exemplary embodiments, as shown in FIG. 6, the optical sensing element may include a first cathode 231, a photoelectric conversion structure 232, and a first anode 233 stacked in turn. In this example, the first cathode 231 and the drain electrode 224 of the fourth transistor M4 may be in an integral structure. The photoelectric conversion structure 232 may include a first doped layer 2321, an intrinsic layer 2322, and a second doped layer 2323 which are sequentially stacked. The first doped layer 2321 may be an N-type semiconductor layer, the second doped layer 2323 may be a P-type semiconductor layer, and the intrinsic layer 2322 may be an I-type semiconductor layer with a lower concentration. P-type semiconductors and N-type semiconductors with high concentrations are doped on both sides of the intrinsic layer 2322. That is, a P-type semiconductor layer and an N-type semiconductor layer are formed. The P-type semiconductor layer and the N-type semiconductor layer are very thin, and the proportion of absorbing incident light is very small, which makes most of the incident light absorbed in the intrinsic layer and produces a large number of electron-hole pairs. On the other hand, the intrinsic layer is thick and occupies almost the entire depletion region, such that the influence of diffusion motion can be reduced and the response speed of photodiodes can be improved by increasing the width of depletion region. The first anode 233 is electrically connected to the anode connection electrode 234. The anode connection electrode 234 is electrically connected to the first anode 233 through vias provided in the first planarization layer 15 and the first passivation layer 14. The first connection electrode 234 and the light-transmissive layer 2411 of the second anode 241 of the light emitting element may be in the same layer structure. The first anode 233 and the anode connection electrode 234 may be made of a transparent conductive material such as Indium Tin Oxide (ITO) or Indium Zinc Oxide (IZO) or the like. The first anode 233 may be electrically connected to the reference voltage line V0 through the anode connection electrode 234.

In some exemplary embodiments, as shown in FIG. 6, the light emitting element may include a second anode 241, an emitting functional layer 242, and a second Cathode 243 which are stacked in turn. The second anode 241 may include a light-transmissive layer 2411 and a reflective layer 2412 stacked. The reflective layer 2412 may be located on the side of the light-transmissive layer 2411 away from the substrate 10. The emitting functional layer 242 is in contact with the second anode 241 within the pixel opening provided on the pixel define layer 244. The light emitting element has a first light emitting region 100 and a second light emitting region 200. The first light emitting region 100 is formed by a stacked light-transmissive layer 2411, a reflective layer 2412, an emitting functional layer 242, and a second cathode 243. The second light emitting region 200 is formed by a light-transmissive layer 2411, an emitting functional layer 242, and a second cathode 243 that are stacked. The orthographic projection of the reflective layer 2412 on the substrate 10 does not overlap with the second light emitting region 200 and may not overlap with an orthographic projection of the optical sensing element on the substrate 10. The orthographic projection of the light-transmissive layer 2411 on the substrate 10 covers the orthographic projection of the second light emitting region 200 on the substrate 10. In some examples, the light-transmissive layer 2411 may be made of a transparent conductive material such as ITO, IZO and the like. The reflective layer 2412 may be made of a metal material, such as magnesium (Mg), argentum (Ag), copper (Cu), aluminum (Al), molybdenum (Mo), lithium (Li), or an alloy material of the above metals, such as aluminum neodymium alloy (AlNd), molybdenum niobium alloy (MoNb), or may be a multi-layer metal structure, such as molybdenum (Mo)/copper (Cu)/molybdenum (Mo), or a stacked structure formed by a metal and a transparent conductive material, such as reflective materials like ITO/Ag/ITO, Mo/AlNd/ITO. However, this embodiment is not limited thereto. For example, the light-transmissive layer may be located on the side of the reflective layer away from the substrate.

In some exemplary embodiments, as shown in FIG. 6, the third insulating layer 13 (i.e. the interlayer insulating layer) may serve as an inorganic hydrogen barrier layer. By controlling the preparation conditions, a third insulating layer with high density is formed to achieve the hydrogen resistance function. For example, the etching rate of the third insulating layer 13 may be about 2 angstroms/second (Å/s). The porosity of the third insulating layer 13 may be less than 10 holes in the range of 1 micron (um)*1 um. The thickness of the third insulating layer 13 may be about 3500 angstroms (Å) to 5000 Å. In some examples, the third insulating layer 13 may be deposited in a manner that satisfies at least one of the following conditions: a deposition power of about 1000 watts (W) to 1500 W (e.g. about 1000 W, 1100 W, 1200 W, 1300 W, 1400 W, 1500 W, etc.); a deposition pressure of about 1800 millitorr (mt) to 2400 mt (e.g. about 1800 mt, 1900 mt, 2000 mt, 2100 mt, 2400 mt, etc.); a deposition time of about 220 seconds (s) to 280 s (for example, about 220 s, 230 s, 240 s, 250 s, 260 s, 270 s, 280 s, etc.). In this example, by achieving the third insulating layer with higher density, the third insulating layer can be used to block the influence of hydrogen atmosphere on the thin film transistor when the optical sensing element is formed, thereby ensuring the electrical performance of the thin film transistor.

Figure 7:
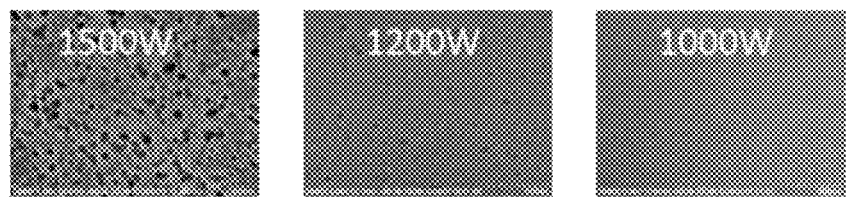
FIG. 7 is a scan electron microscope view of an interlayer insulating layer obtained under different deposition power conditions according to at least one embodiment of the present disclosure.

FIG. 7 is a scan electron microscope view of an interlayer insulating layer obtained under different deposition power conditions according to at least one embodiment of the present disclosure. As shown in FIG. 7, the density of the interlayer insulating layer is obviously improved when the deposition power is about 1000 W to 1500 W under the same other parameters.

In the present exemplary embodiment, the third insulating layer (i.e., the interlayer insulating layer) is used as the inorganic hydrogen barrier layer, so that the influence of hydrogen element on the thin film transistor can be blocked during the preparation process of the optical sensing element, thereby ensuring the electrical performance of the thin film transistor and improving the display effect.

Figure 8:
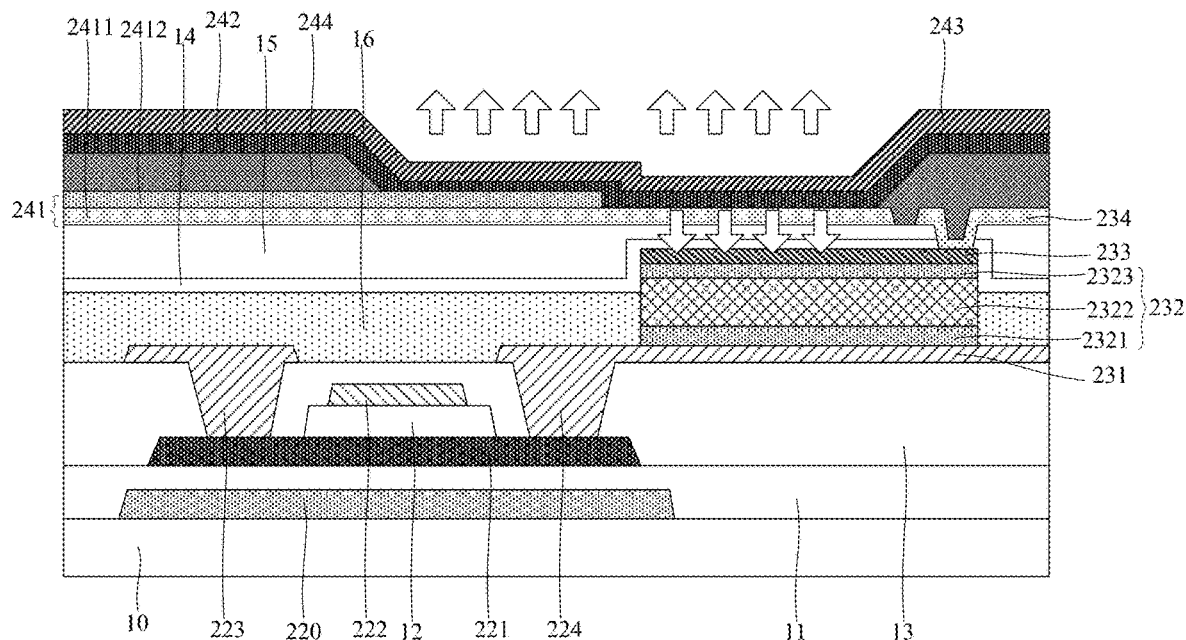
FIG. 8 is another partial schematic section view of a display substrate according to at least one embodiment of the present disclosure.

FIG. 8 is another partial schematic section view of a display substrate according to at least one embodiment of the present disclosure. In some exemplary embodiments, as shown in FIG. 8, in a direction perpendicular to the display substrate, the display substrate includes a substrate 10, a circuit structure layer, a second passivation layer 16, a sensing structure layer, a first passivation layer 14, a first planarization layer 15, and a light emitting structure layer sequentially disposed on the substrate. An orthographic projection of the second passivation layer 16 on the substrate 10 does not overlap with an orthographic projection of the photoelectric conversion structure 232 of the optical sensing element of the sensing structure layer on the substrate 10. In this example, the inorganic hydrogen barrier layer may include a third insulating layer 13 and a second passivation layer 16; alternatively, a second passivation layer 16 may be included. However, this embodiment is not limited thereto.

In some exemplary embodiments, the second passivation layer 16 may include a stacked first inorganic layer and a second inorganic layer. The thickness ratio of the first inorganic layer to the second inorganic layer may be about 1:1. For example, the thickness of the first inorganic layer and the second inorganic layer may be about 1000 Å to 3000 Å, for example, 1000 Å, 2000 Å or 3000 Å. The first inorganic layer and the second inorganic layer of the second passivation layer 16 may be prepared by deposition. For example, the deposition mode of the first inorganic layer can satisfy the following conditions: the deposition power is about 500 W to 1000 W, the deposition pressure is about 1000 mt to 2000 mt, and the gas flow ratio of SiH and N2O is about 1:30 to 1:50. The deposition mode of the second inorganic layer may satisfy the following conditions: the deposition power is about 1000 W to 2000 W, the deposition pressure is about 1000 mt to 2000 mt, and the gas flow ratio of SiH to N2O is about 1:30 to 1:50. The materials of the first inorganic layer and the second inorganic layer may be SiO. However, this embodiment is not limited thereto.

In some exemplary embodiments, as shown in FIG. 8, after the first source-drain metal layer is prepared, the first inorganic layer and the second inorganic layer of the first passivation layer 16 are prepared by deposition, followed by the photoelectric conversion structure 232 of the optical sensing element. In this process, the first passivation layer 16 can be used to block the influence of the hydrogen atmosphere on the transistor during the fabrication of the photoelectric conversion structure 232.

For the rest of the structure of the display substrate of this embodiment, reference may be made to descriptions of the aforementioned embodiments, and thus will not be repeated here.

Figure 9:
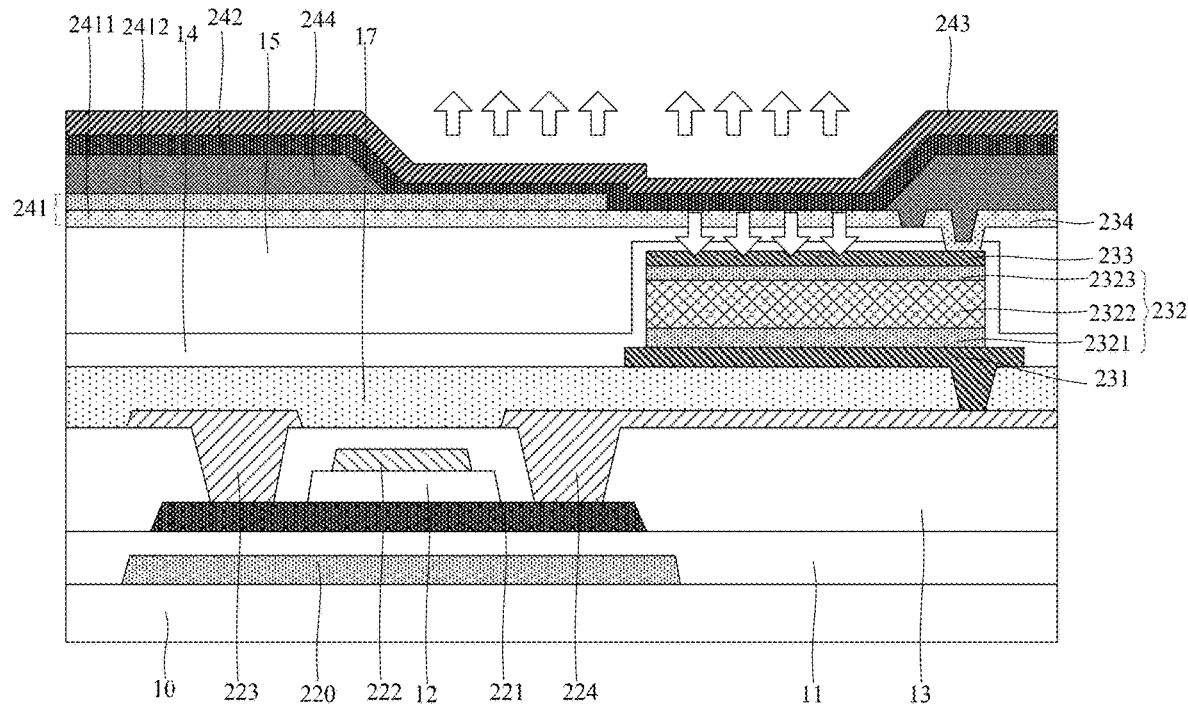
FIG. 9 is another partial schematic section view of a display substrate according to at least one embodiment of the present disclosure.

FIG. 9 is another partial sectional schematic diagram of a display substrate according to at least one embodiment of the present disclosure; In some exemplary embodiments, as shown in FIG. 9, in a direction perpendicular to the display substrate, the display substrate may include a substrate 10, a circuit structure layer, a third passivation layer 17, a sensing structure layer, a first passivation layer 14, a first planarization layer 15, and a light emitting structure layer sequentially disposed on the substrate. The third passivation layer 17 is located on the side of the optical sensing element close to the substrate 10. The orthographic projection of the third passivation layer 17 on the substrate 10 overlaps with an orthographic projection of the optical sensing element on the substrate 10. The first cathode 231 of the optical sensing element may be in the same layer structure as the second source-drain metal layer of the circuit structure layer. The second source-drain metal layer is located on the side of the first source-drain metal layer of the circuit structure layer away from the substrate 10. The first cathode 231 may be electrically connected to the drain electrode 224 of the fourth transistor M4 of the light emission detection circuit of the first source-drain metal layer through a via on the third passivation layer 17. In this example, the inorganic hydrogen barrier layer may include a third passivation layer 17; alternatively, the third passivation layer 17 and the third insulating layer 13 may be included. However, this embodiment is not limited thereto.

In some exemplary embodiments, the material of the third passivation layer 17 may be SiO. The thickness of the third passivation layer 17 may be about 1000 Å to 3000 Å, for example, 1000 Å, 2000 Å or 3000 Å. The third passivation layer 17 may be prepared by deposition. For example, the third passivation layer 17 may be deposited in such a manner that the deposition power is about 500 W to 1000 W, the deposition pressure is about 1000 mt to 2000 mt, and the gas flow ratio of SiH and N2O is about 1:30 to 1:50. However, this embodiment is not limited thereto.

For the rest of the structure of the display substrate of this embodiment, reference may be made to descriptions of the aforementioned embodiments, and thus will not be repeated here.

Figure 10:
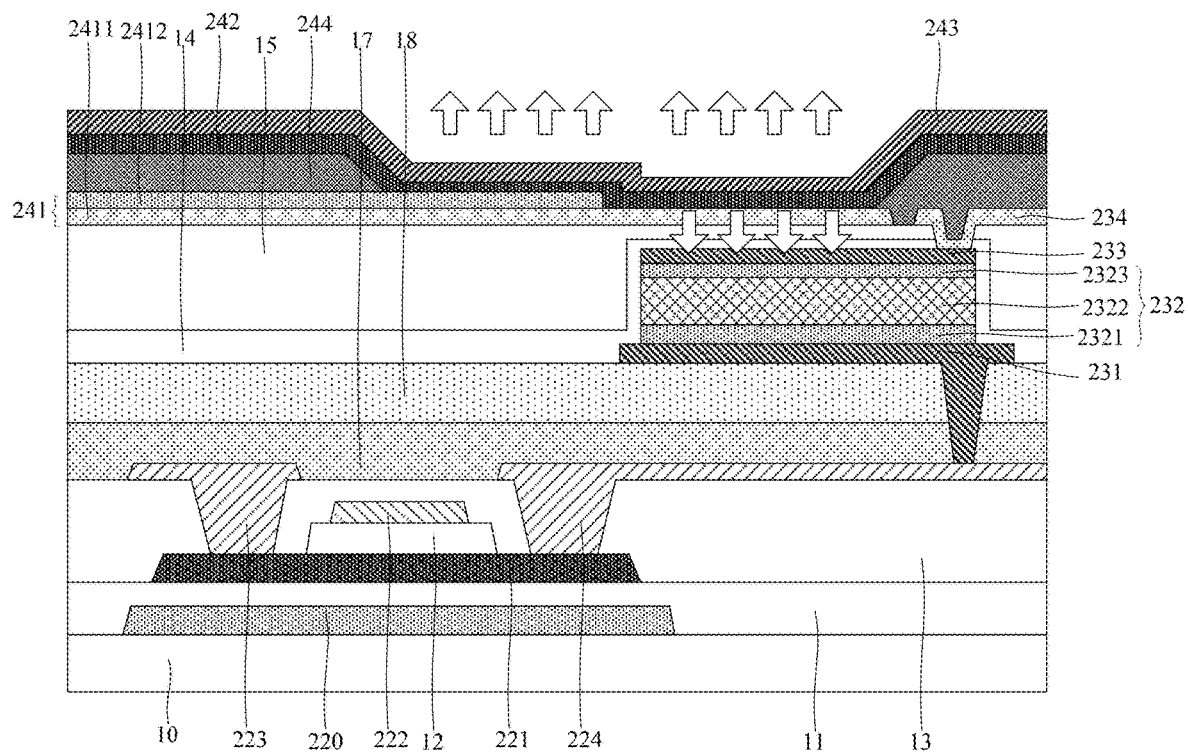
FIG. 10 is another partial schematic section view of a display substrate according to at least one embodiment of the present disclosure.

FIG. 10 is another partial sectional schematic diagram of a display substrate according to at least one embodiment of the present disclosure; In some exemplary embodiments, as shown in FIG. 10, in a direction perpendicular to the display substrate, the display substrate may include a substrate 10, a circuit structure layer, a third passivation layer 17, a fourth passivation layer 18, a sensing structure layer, a first passivation layer 14, a first planarization layer 15, and a light emitting structure layer sequentially disposed on the substrate. The orthographic projection of the third passivation layer 17 on the substrate 10 overlaps with an orthographic projection of the optical sensing element on the substrate 10. The orthographic projection of the fourth passivation layer 18 on the substrate 10 overlaps with an orthographic projection of the optical sensing element on the substrate 10. In some examples, the circuit structure layer may include: a shield layer 220, a semiconductor layer, a gate metal layer, a first source-drain metal layer and a second source-drain metal layer provided on the substrate 10. The first cathode 231 of the optical sensing element and the second source-drain metal layer may be in the same layer structure. However, this embodiment is not limited thereto.

In this example, the inorganic hydrogen barrier layer may include: a fourth passivation layer 18; alternatively, a third passivation layer 17 and a fourth passivation layer 18 may be included; alternatively a third passivation layer 17 a fourth passivation layer 18 and a third insulating layer 13 may be included. However, this embodiment is not limited thereto.

In some exemplary embodiments, the material of the third passivation layer 17 and the fourth passivation layer 18 may be SiO. The thickness of the third passivation layer 17 and the fourth passivation layer 18 may be about 1000 Å to 3000 Å, for example, 1000 Å, 2000 Å or 3000 Å. The third passivation layer 17 and the fourth passivation layer 18 may be prepared by deposition. For example, the third passivation layer 17 or the fourth passivation layer 18 may be deposited in such a manner that the deposition power is about 500 W to 1000 W, the deposition pressure is about 1000 mt to 2000 mt, and the gas flow ratio of SiH and N2O is about 1:30 to 1:50. However, this embodiment is not limited thereto.

For the rest of the structure of the display substrate of this embodiment, reference may be made to descriptions of the aforementioned embodiments, and thus will not be repeated here.

Figure 11:
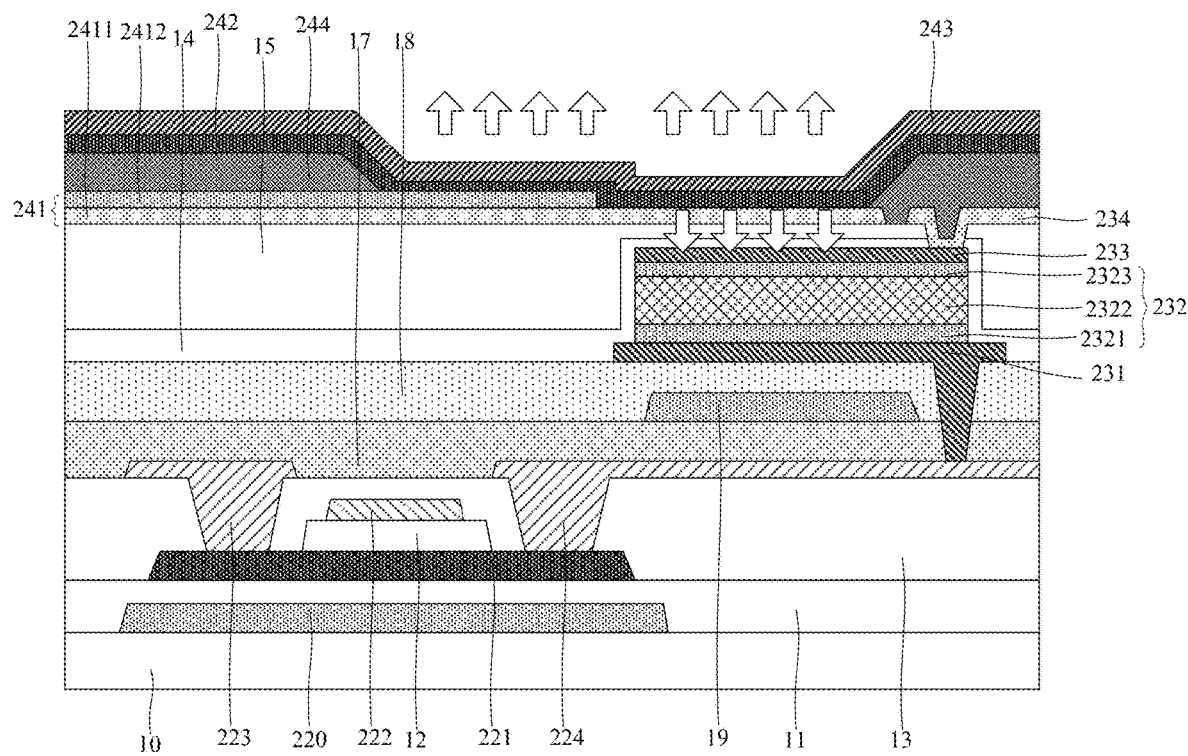
FIG. 11 is another partial sectional schematic diagram of a display substrate according to at least one embodiment of the present disclosure.

FIG. 11 is another partial sectional schematic diagram of a display substrate according to at least one embodiment of the present disclosure; In some exemplary embodiments, as shown in FIG. 11, in a direction perpendicular to the display substrate, the display substrate may include a substrate 10, a circuit structure layer, a third passivation layer 17, an organic hydrogen barrier layer 19, a fourth passivation layer 18, a sensing structure layer, a first passivation layer 14, a first planarization layer 15, and a light emitting structure layer sequentially disposed on the substrate. In this example, an organic hydrogen barrier layer 19 is provided between the third passivation layer 17 and the fourth passivation layer 18. The orthographic projection of the organic hydrogen barrier layer 19 on the substrate 10 overlaps with an orthographic projection of the optical sensing element on the substrate 10. For example, an orthographic projection of the organic hydrogen barrier layer 19 on the substrate 10 may be elongated below the optical sensing element. However, this embodiment is not limited thereto. In some examples, the organic hydrogen barrier layer may alternatively be a monolayer structure, i.e. an orthographic projection of the organic hydrogen barrier layer with the monolayer structure on the substrate may cover an orthographic projection of a plurality of optical sensing elements on the substrate. The organic hydrogen barrier layer completely covers the thin film transistor underneath, which can prevent the hydrogen atmosphere in the process of forming optical sensing elements from affecting the electrical performance of the thin film transistor, and can effectively improve the high current problem of the thin film transistor.

In this example, the inorganic hydrogen barrier layer may include: a fourth passivation layer 18; alternatively, a third passivation layer 17 and a fourth passivation layer 18 may be included; alternatively a third passivation layer 17 a fourth passivation layer 18 and a third insulating layer 13 may be included. However, this embodiment is not limited thereto.

In some exemplary embodiments, the organic hydrogen barrier layer 19 may have a lower curing temperature and a higher thermal decomposition temperature. The organic hydrogen barrier layer 19 can satisfy at least one of the following conditions: a curing temperature is lower than 230 degrees Celsius; the thermal decomposition temperature is greater than 450 degrees Celsius. By setting the curing temperature of the organic hydrogen barrier layer 19 lower than 230 degrees Celsius, the curing process of the organic hydrogen barrier layer 19 will not adversely affect the thin film transistor, thereby effectively improving the problem that the thin film transistor is abnormal due to large current in an environment higher than 230 degrees Celsius. By setting the thermal decomposition temperature of the organic hydrogen barrier layer 19 to be greater than 450 degrees Celsius, the organic hydrogen barrier layer 19 can effectively withstand the high temperature in the deposition process of the optical sensing element, does not denature and decompose under the deposition temperature condition, and has good high temperature resistance and stability.

In some examples, the material of the organic hydrogen barrier layer 19 may be an organic insulating material such as a Silicon On Glass (SOG) or a resin material or the like. The organic hydrogen barrier layer 19 can not only well block the influence of hydrogen on the thin film transistor, but also effectively improve the dark current problem of the optical sensing element, and is easy to process.

In the exemplary embodiment, by arranging the inorganic hydrogen barrier layer and the organic hydrogen barrier layer, hydrogen blocking in the preparation process of the optical sensing element can be achieved, hydrogen element penetration into the transistor can be reduced, and normal electrical characteristics of the transistor can be ensured, thereby improving the yield of the display substrate and improving the display effect.

Hereinafter, a plan view structure of the display substrate of the embodiment shown in FIG. 11 will be described as an example.

Figure 12:
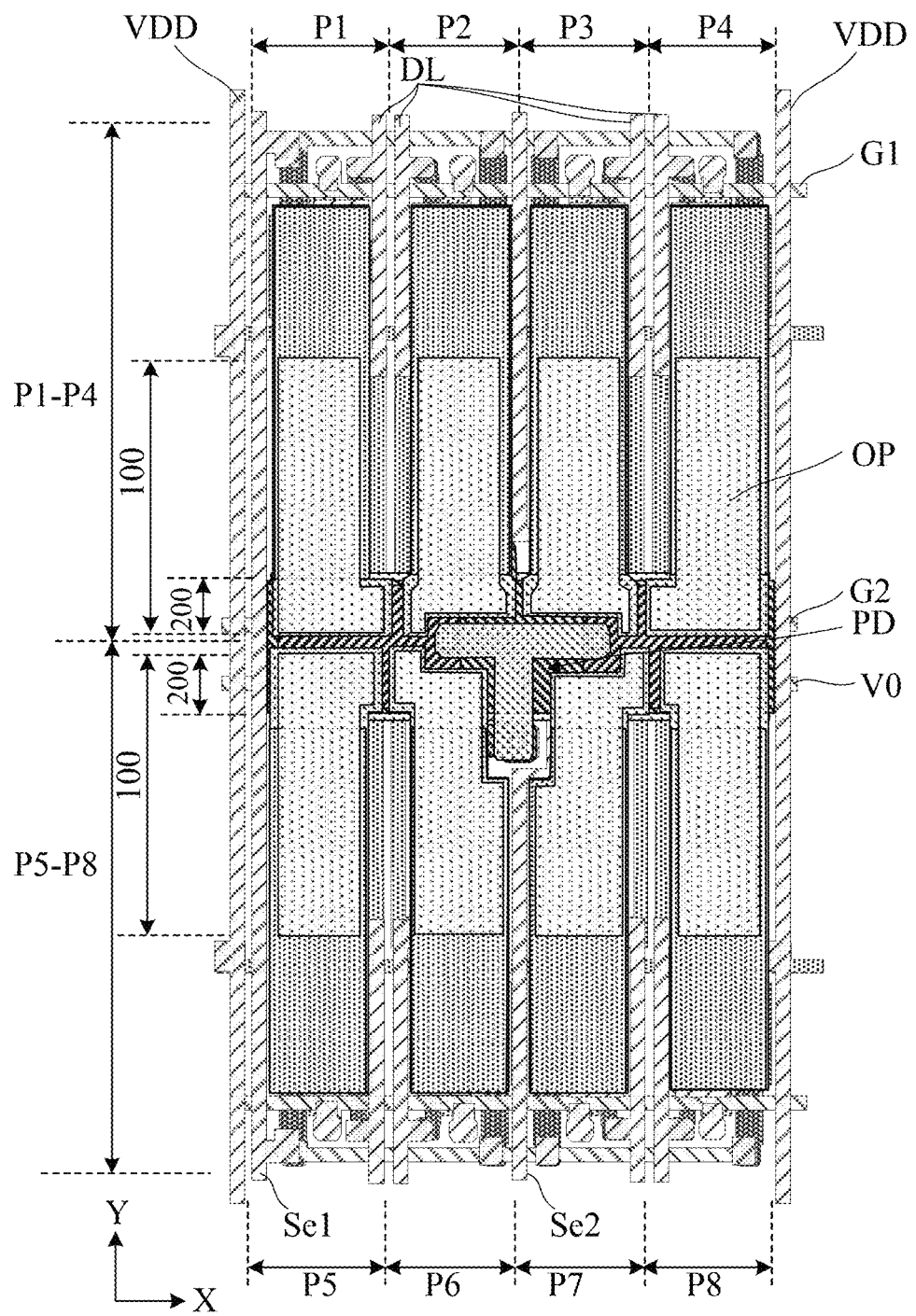
FIG. 12 is a partial schematic top view of a display substrate according to at least one embodiment of the present disclosure.

FIG. 12 is a partial schematic top view of a display substrate according to at least one embodiment of the present disclosure. Eight light emitting units (i.e. first light emitting units P1 to eighth light emitting units P8) and one light detection unit PD are schematically illustrated in FIG. 12 in a top view. The eight light emitting units are arranged in two rows and four columns, and the light detection unit PD is located in the middle of the two rows of light emitting units and overlaps with the second light emitting region 200 of the light emitting elements of the eight light emitting units.

Figure 13A:
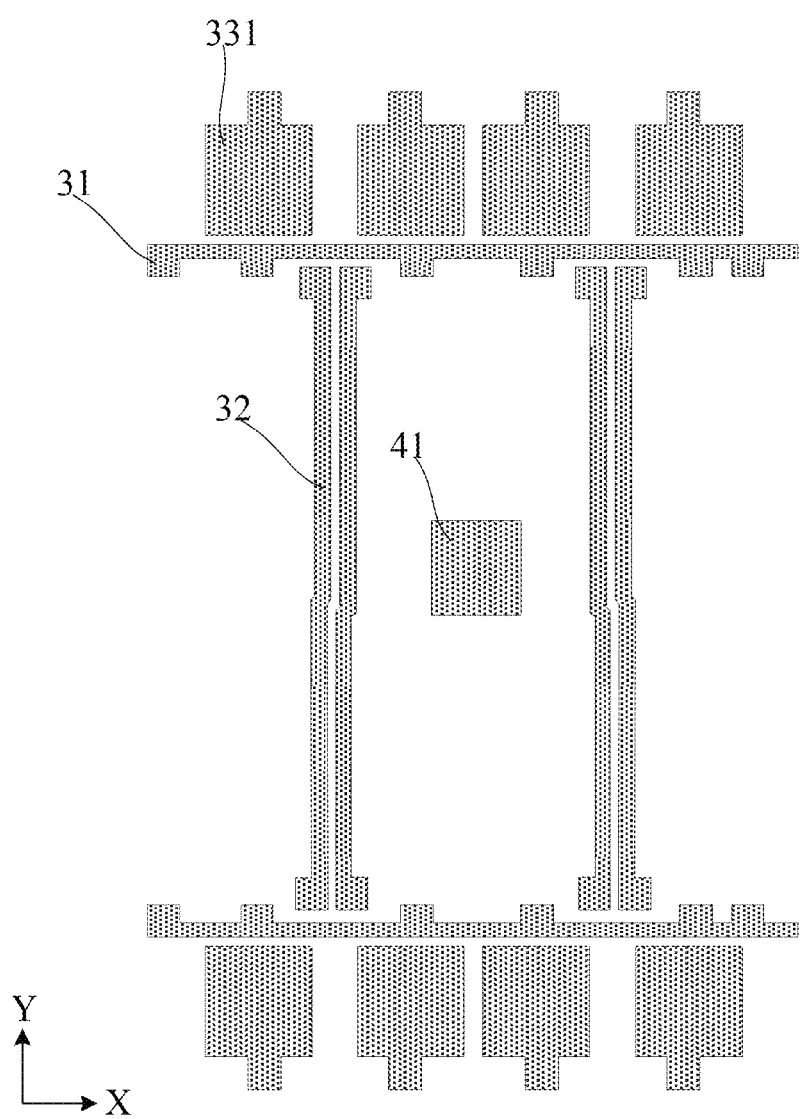
FIG. 13A is a partial schematic top view of a display substrate after a shield layer is formed according to at least one embodiment of the present disclosure.
Figure 13B:
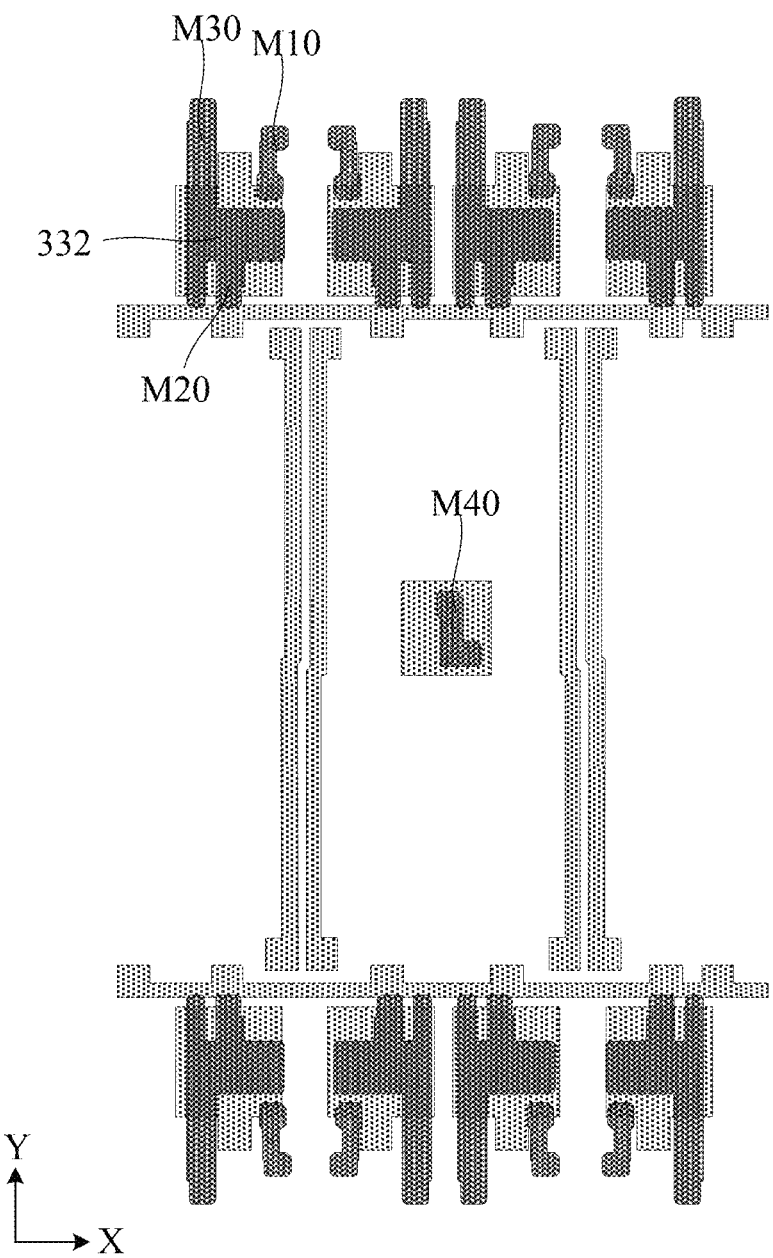
FIG. 13B is a partial schematic top view of a display substrate after a semiconductor layer is formed according to at least one embodiment of the present disclosure.
Figure 13C:
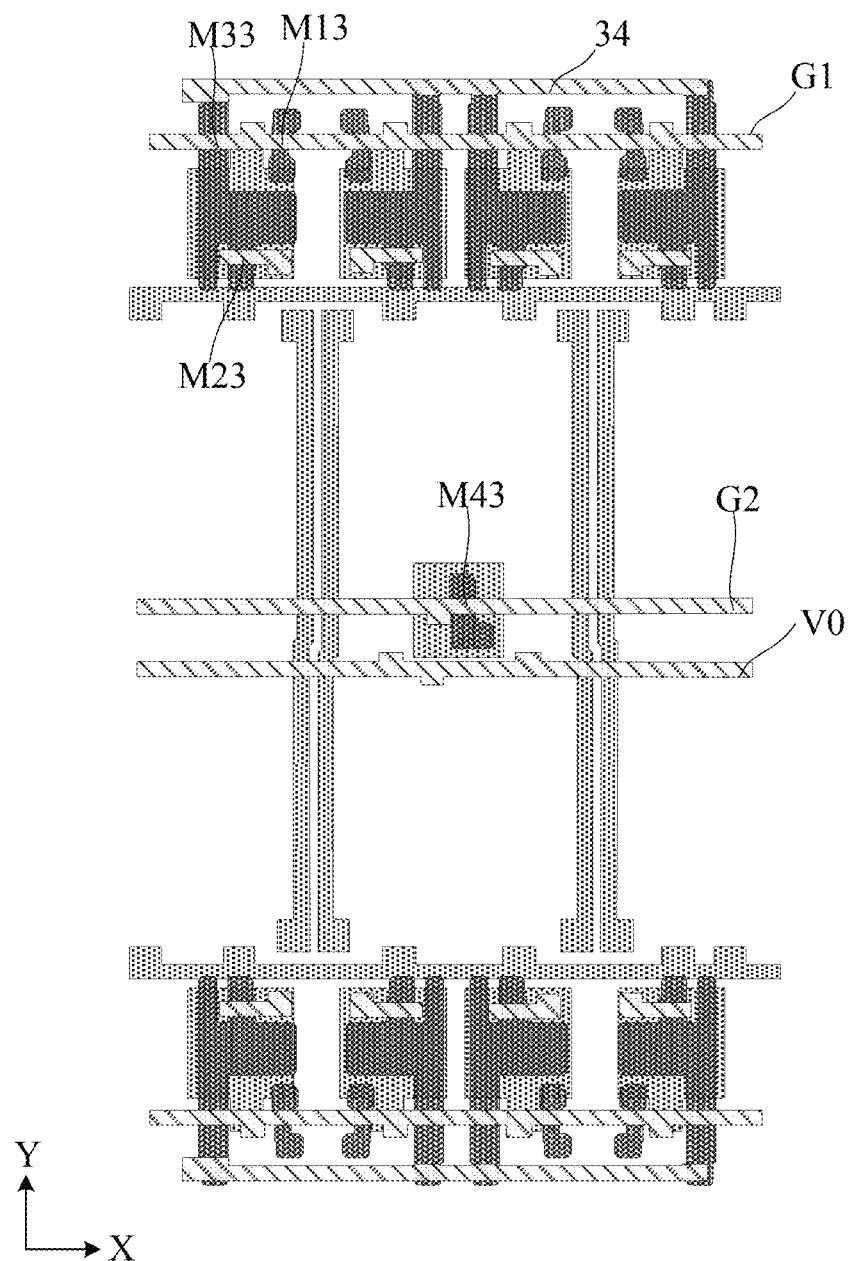
FIG. 13C is a partial schematic top view of a display substrate after a gate metal layer is formed according to at least one embodiment of the present disclosure.
Figure 13D:
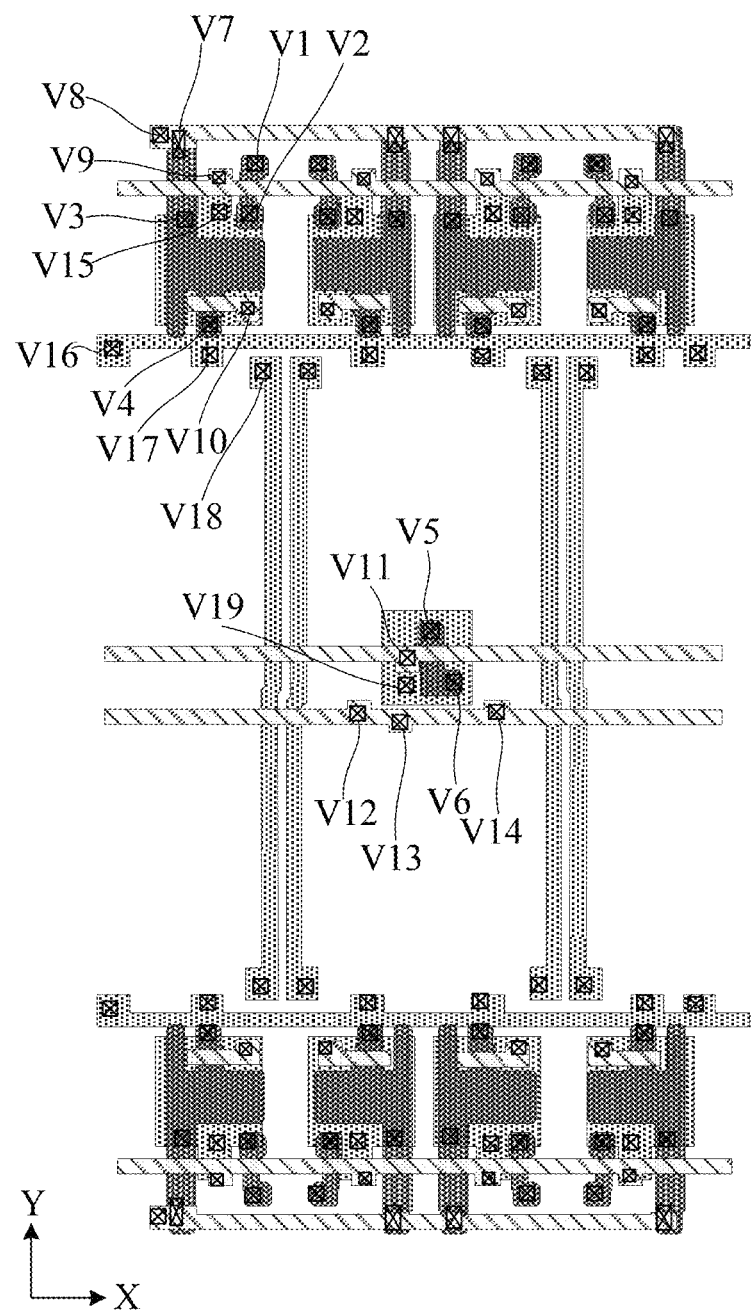
FIG. 13D is a partial schematic top view of a display substrate after a third insulating layer is formed according to at least one embodiment of the present disclosure.
Figure 13E:
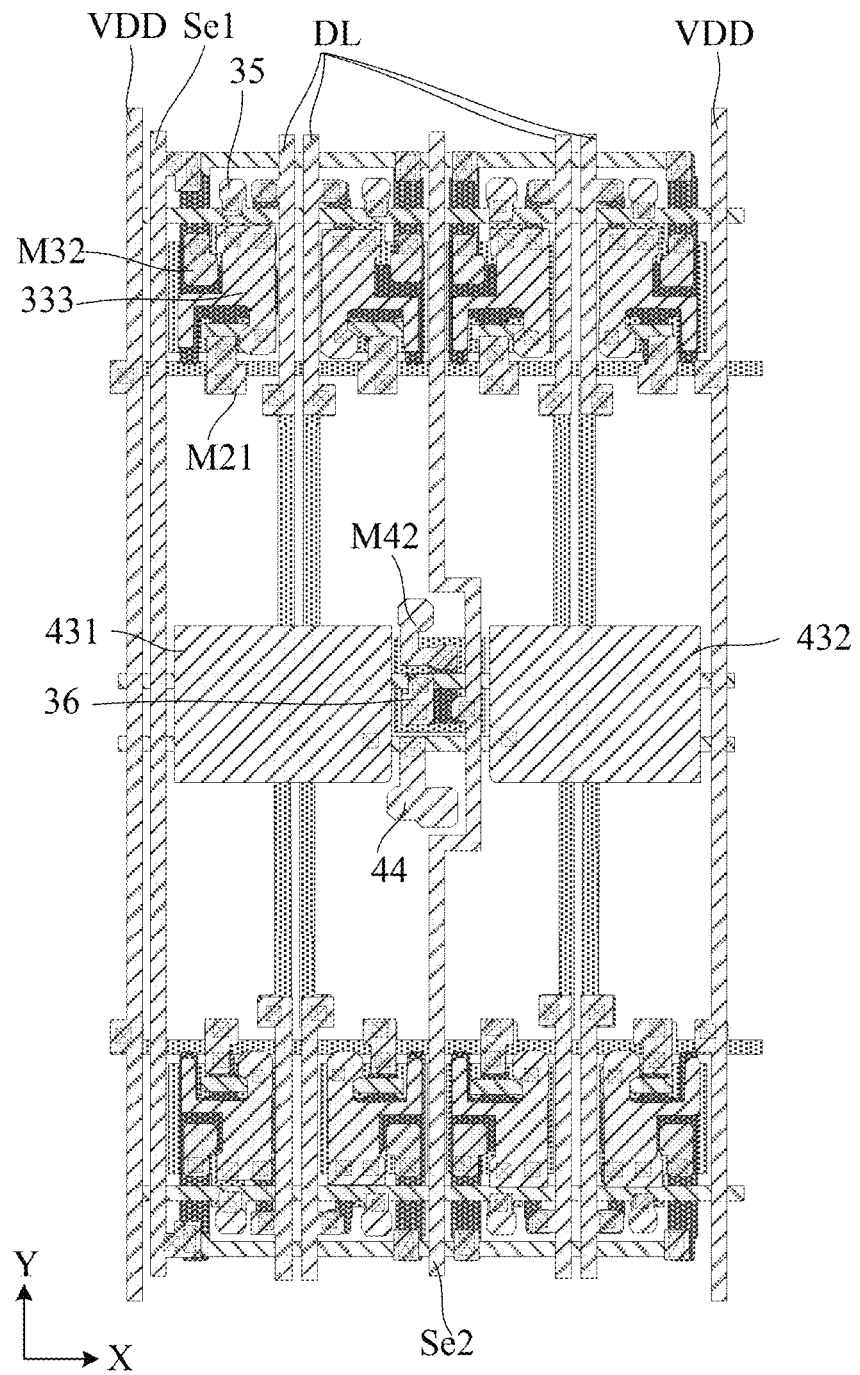
FIG. 13E is a partial schematic top view of a display substrate after a first source-drain metal layer is formed according to at least one embodiment of the present disclosure.
Figure 13F:
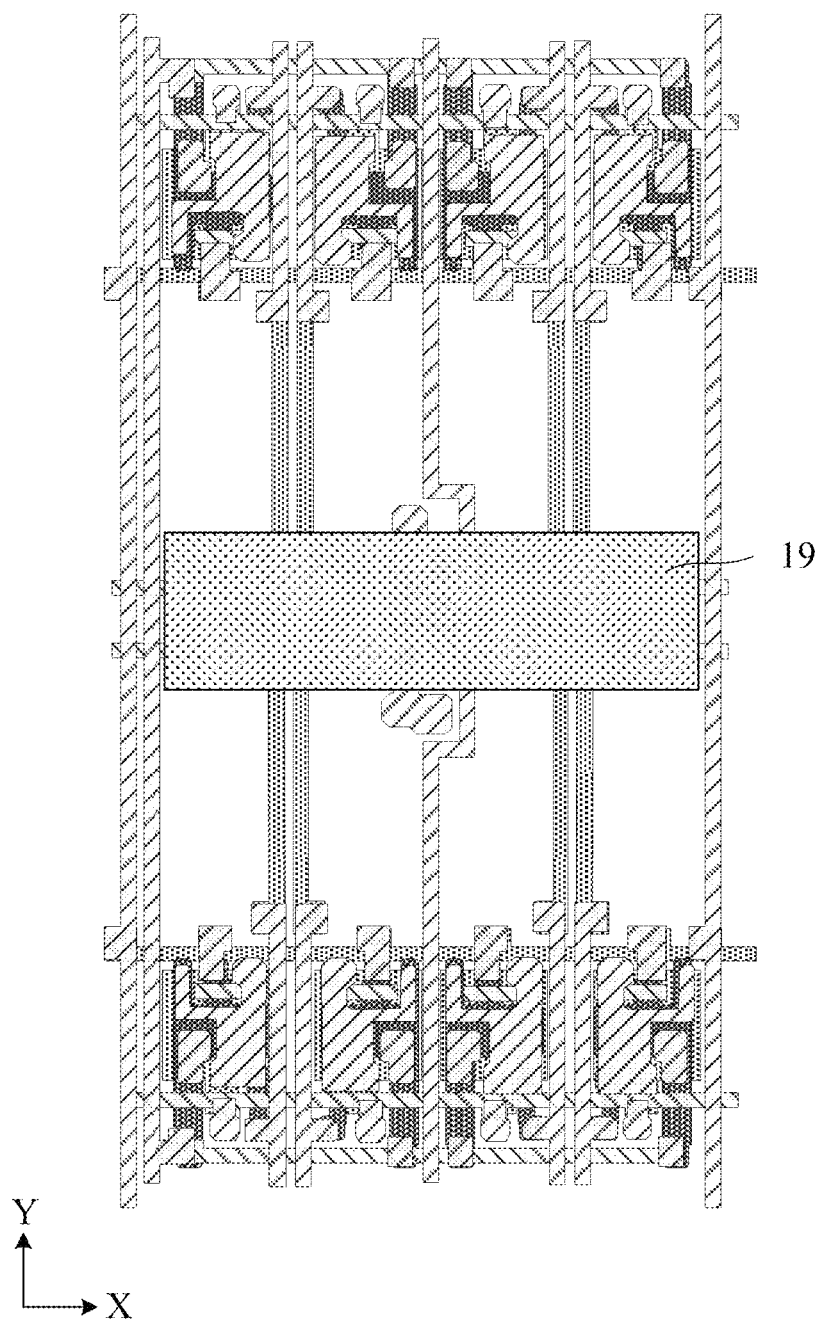
FIG. 13F is a partial schematic top view of a display substrate after an organic hydrogen barrier layer is formed according to at least one embodiment of the present disclosure.
Figure 13G:
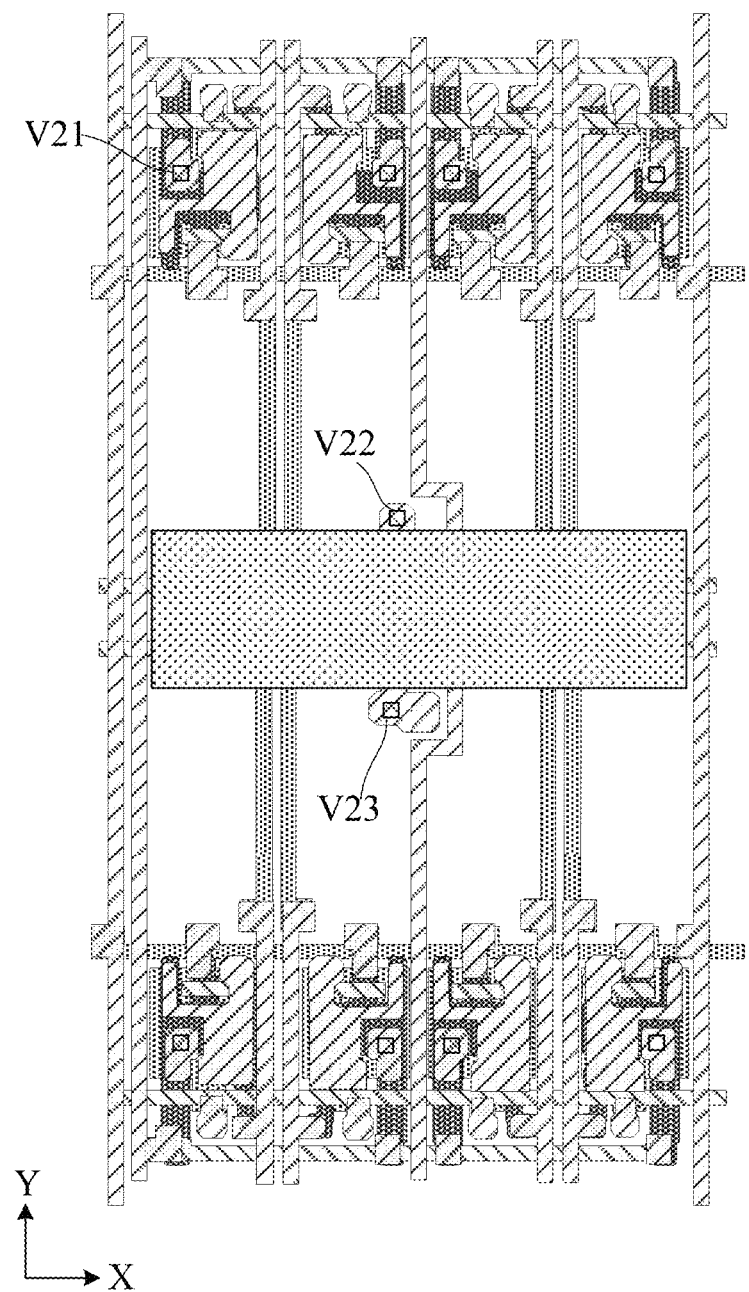
FIG. 13G is a partial schematic top view of a display substrate after a fourth passivation layer is formed according to at least one embodiment of the present disclosure.
Figure 13H:
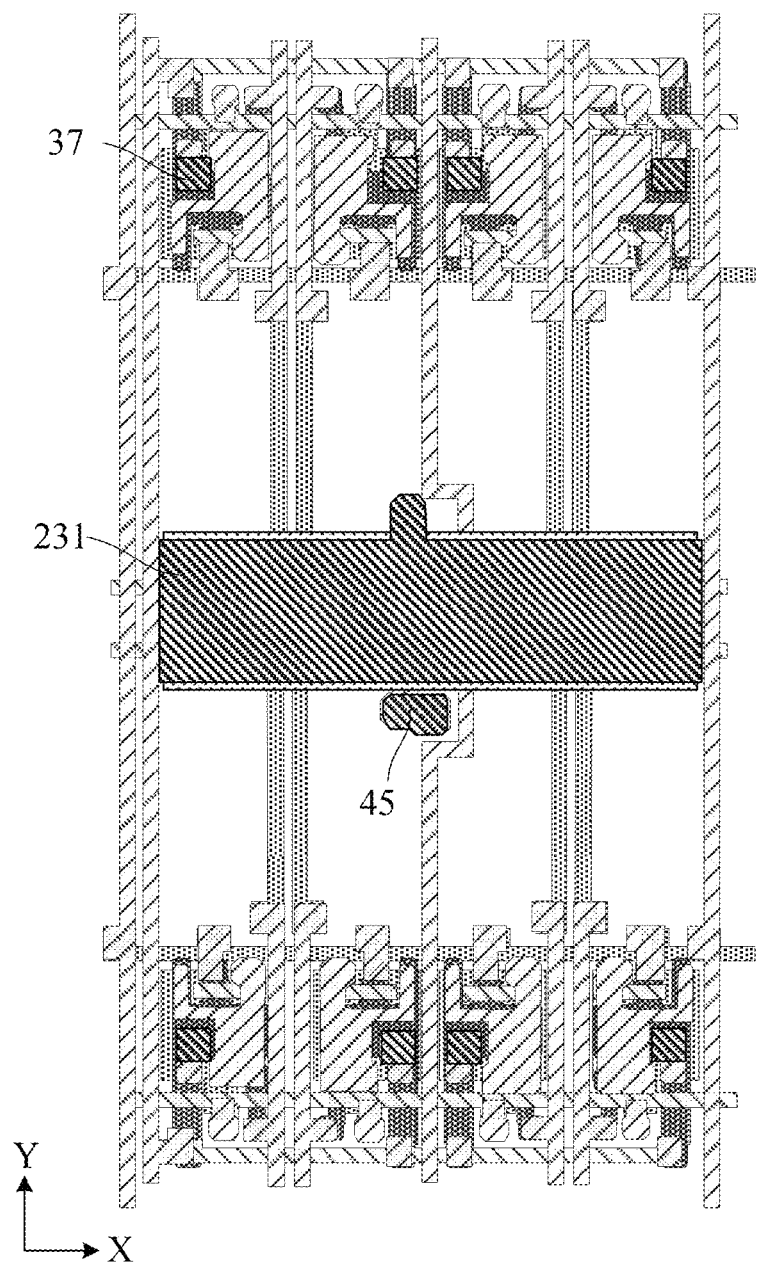
FIG. 13H is a partial schematic top view of a display substrate after a second source-drain metal layer and a first cathode of an optical sensing element are formed according to at least one embodiment of the present disclosure.
Figure 13I:
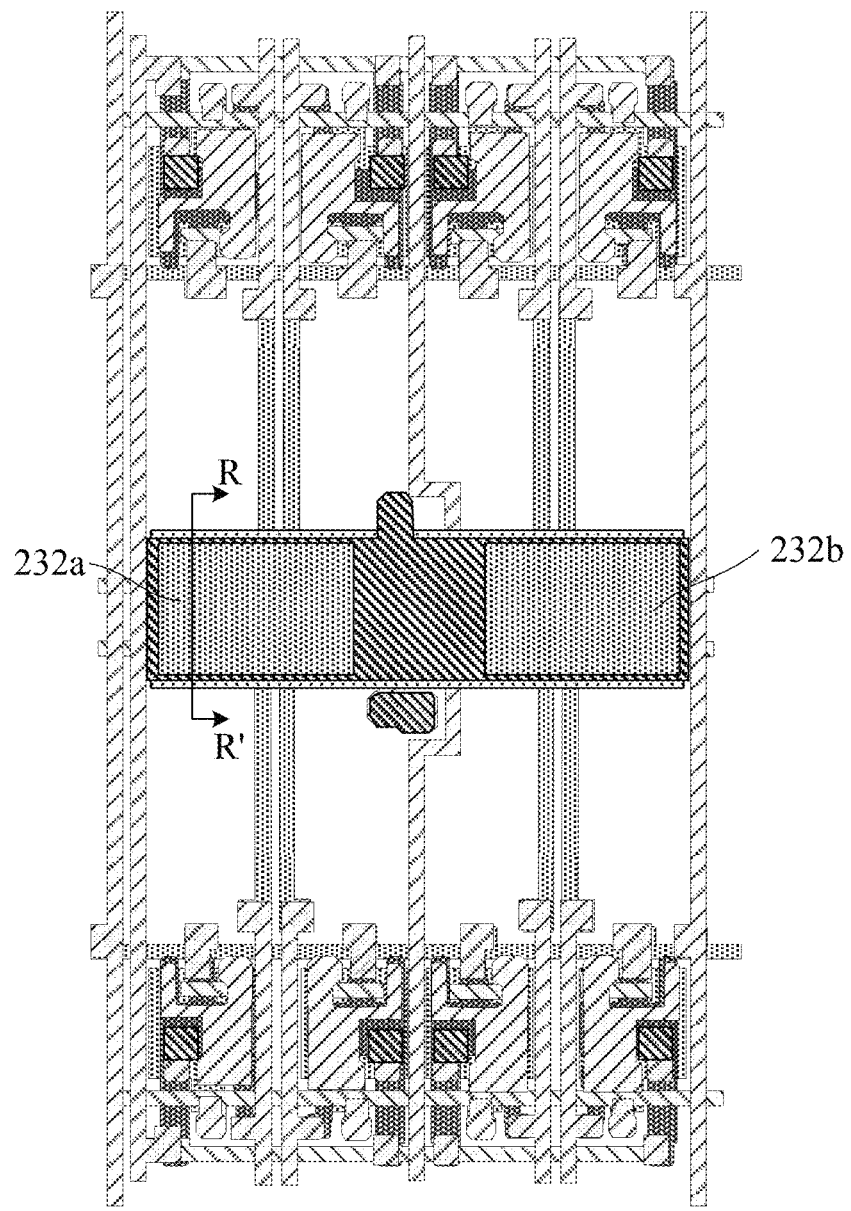
FIG. 13I is a partial schematic top view of a display substrate after a photoelectric conversion structure is formed according to at least one embodiment of the present disclosure.
Figure 13J:
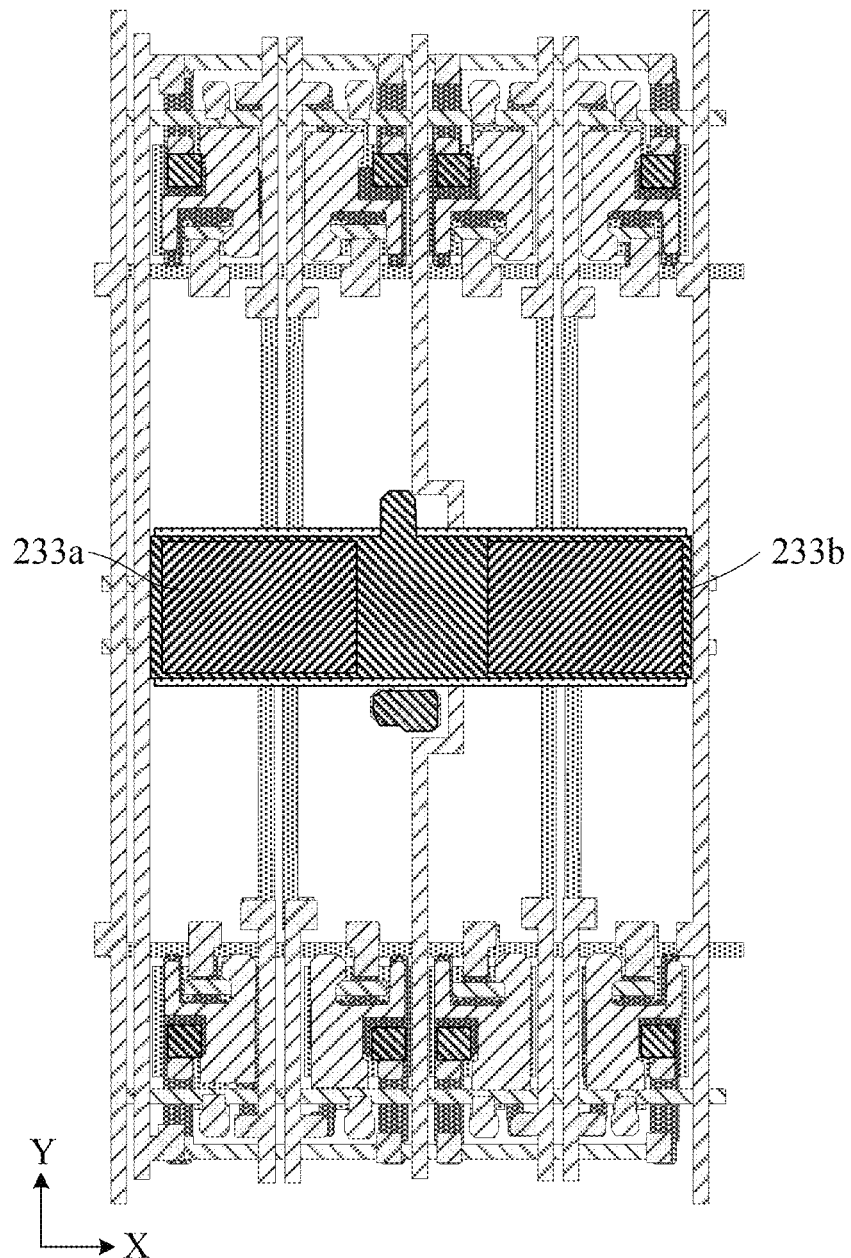
FIG. 13J is a partial schematic top view of a display substrate after a first anode of an optical sensing element is formed according to at least one embodiment of the present disclosure.
Figure 13K:
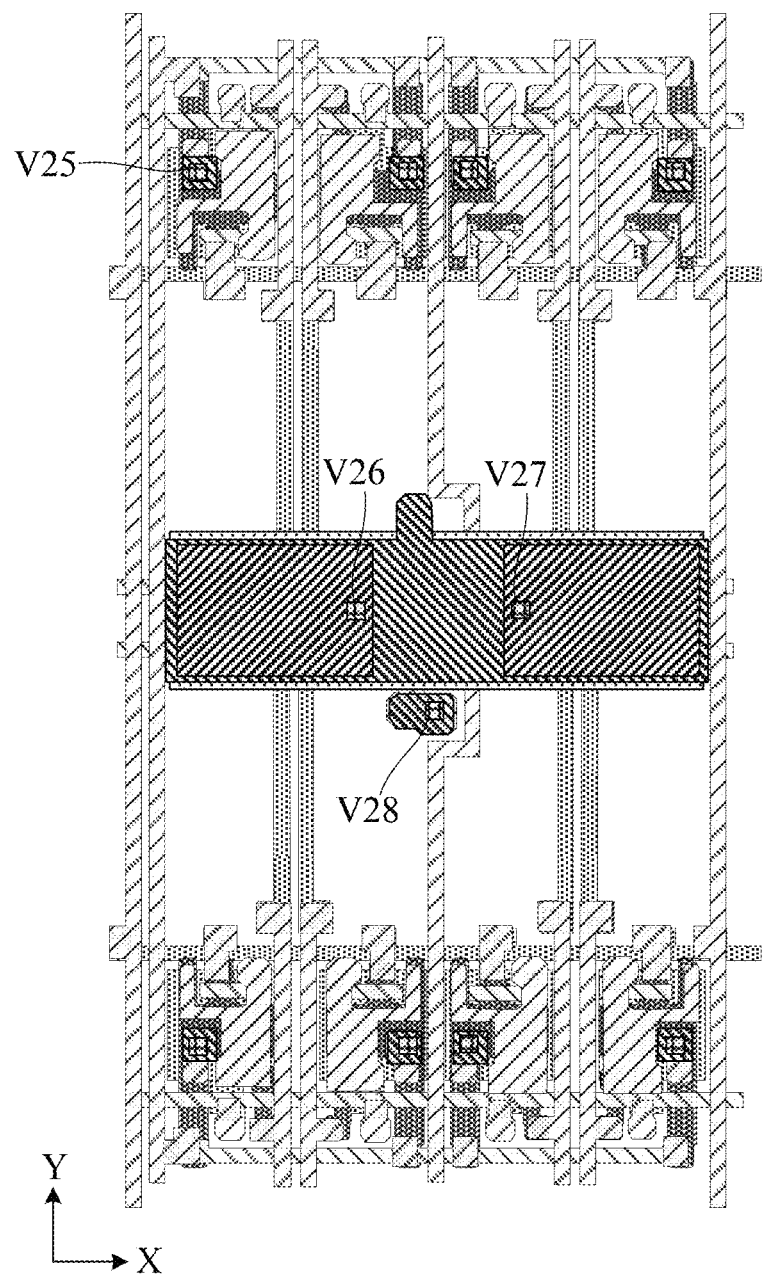
FIG. 13K is a partial schematic top view of a display substrate after a first planarization layer is formed according to at least one embodiment of the present disclosure.
Figure 13L:
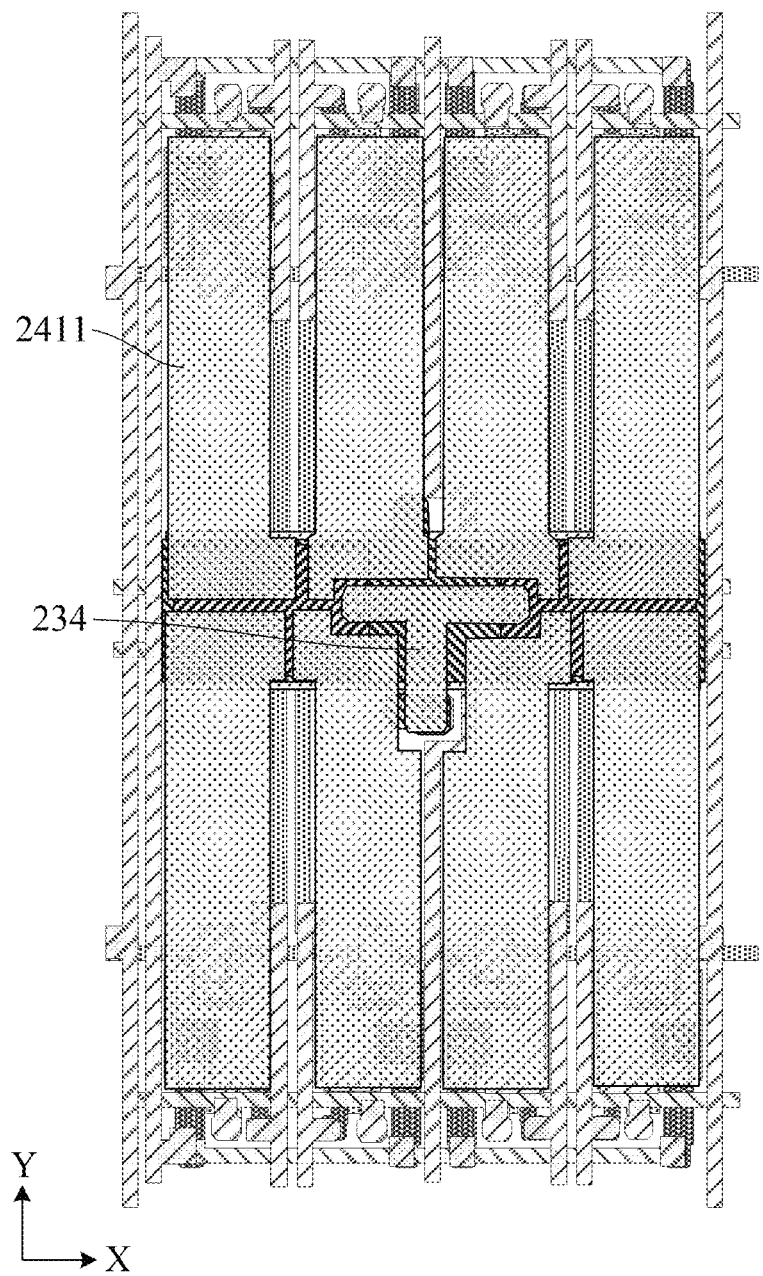
FIG. 13L is a partial schematic top view of a display substrate after a light-transmissive layer and an anode connection electrode are formed according to at least one embodiment of the present disclosure.
Figure 13M:
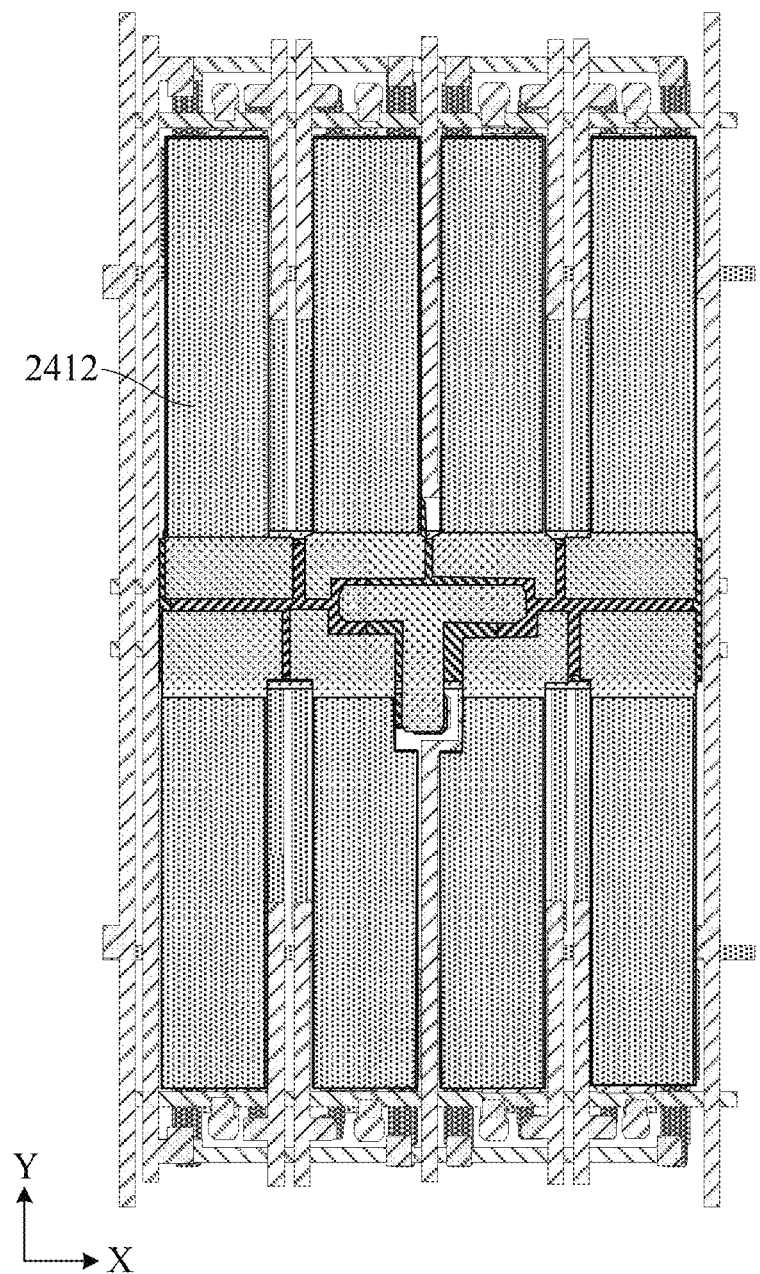
FIG. 13M is a partial schematic top view of a display substrate after a reflective layer is formed according to at least one embodiment of the present disclosure.
Figure 13N:
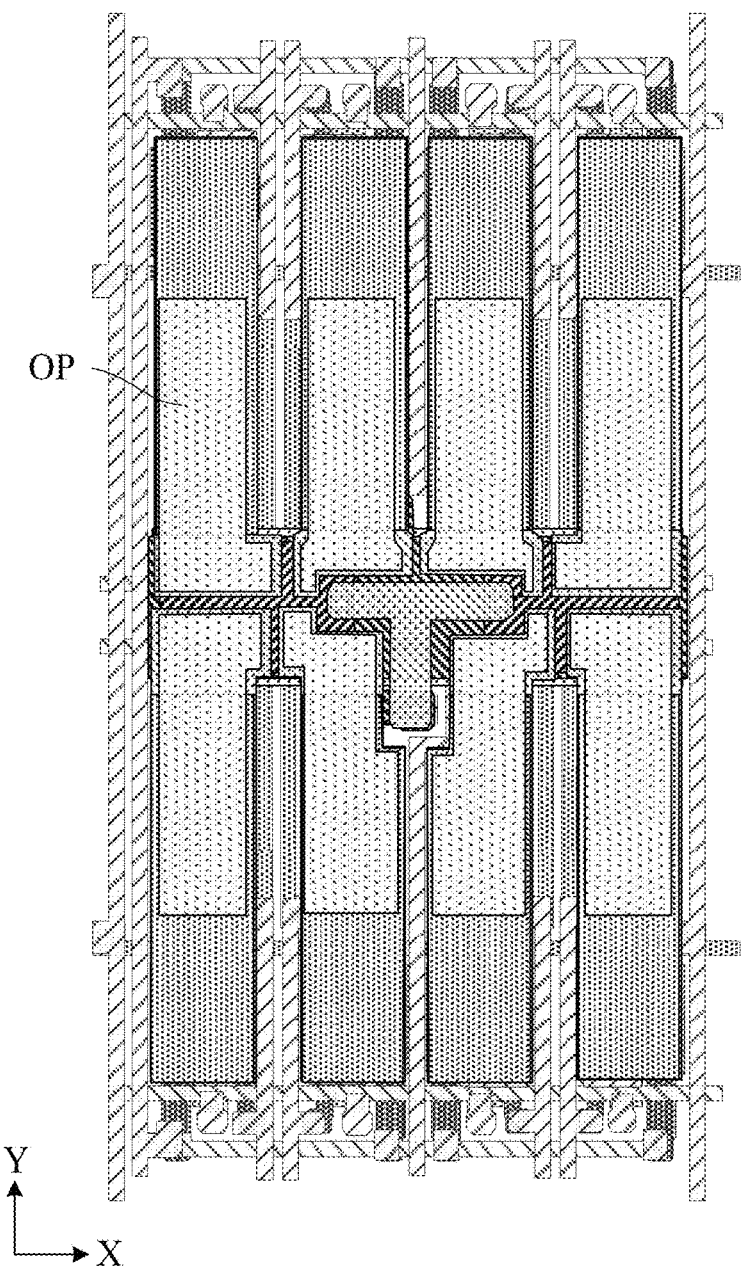
FIG. 13N is a partial schematic top view of a display substrate after a pixel define layer is formed according to at least one embodiment of the present disclosure.

The following refers to FIGS. 13A to 13N and illustrates the technical solution of the embodiment by an example of the preparation process of the display substrate of the embodiment. The "patterning process" mentioned in the embodiments includes processes, such as photoresist coating, mask exposure, development, etching and photoresist stripping for metal materials, inorganic materials or transparent conductive materials, and includes organic material coating, mask exposure and development for organic materials. Deposition may be implemented by any one or more of sputtering, the evaporation and chemical vapor deposition, coating may be implemented by any one or more of spraying coating, spin coating and ink-jet printing, and the etching may be implemented by any one or more of dry etching and wet etching, and these are not limited in the present disclosure. A "thin film" refers to a layer of thin film formed by a material on a substrate through deposition, coating, or other processes. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" which has experienced the patterning process at least includes one "pattern".

"A and B are configured on the same layer" in the embodiments of the present disclosure, refers to that A and B are formed simultaneously by a same patterning process. The "same layer" does not always mean that the thickness of the layer or the height of the layer is the same in a sectional view. "An orthographic projection of A contains an orthographic projection of B" refers to that an orthographic projection of B falls in a range of an orthographic projection of A or an orthographic projection of A covers an orthographic projection of B.

A process for preparing a display substrate of the present embodiment may include following actions. The pixel circuit of this example is a 3T1C structure shown in FIG. 3 and the light emission detection circuit is a 1T1C structure shown in FIG. 4.

(1) Forming a Shield Layer on the Substrate.

In some exemplary embodiments, a first metal film is deposited on a substrate 10, the first metal film is patterned through a patterning process, and a shield layer is formed on the substrate 10 as shown in FIG. 13A. The shield layer may include a first electrode plate 331, a first power transfer line 31, a data connection line 32, and a sensing shield layer 41. The first power transfer line 31 has a horizontal strip structure spanning a row of four light emitting units in the first direction X. The data connection line 32 extends in the second direction Y and is located between close first power transfer lines 31. The first direction X and the second direction Y intersect, for example, they are perpendicular to each other. The sensing shield layer 41 is located between the data connection lines 32 and has a block structure. The sensing shield layer 41 is configured to shade the fourth transistor of the light emission detection circuit to ensure the performance of the transistor. In an exemplary implementation, the first electrode plate 331 not only serves as a first electrode plate of the first storage capacitor and is configured to form the first storage capacitor with the second electrode plate formed subsequently, but also serves as a shield layer and is configured to shield light for the transistors of the pixel circuit to decrease the intensity of the light irradiated onto the transistors and reduce the leakage current, thereby reducing the influence of illumination on the properties of the transistors.

(2) Forming a Semiconductor Layer.

In some exemplary embodiments, on the substrate 10 on which the aforementioned pattern is formed, a first insulating film and a semiconductor film are sequentially deposited, and the semiconductor film is patterned through a patterning process to form a first insulating layer 11 covering the shield layer, and form a semiconductor layer formed on the first insulating layer 11, as shown in FIG. 13B. The material of the semiconductor layer may be a metal oxide. The semiconductor layer may include a first active layer M10 of a first transistor M1 of a pixel circuit, a second active layer M20 of a second transistor M2, a third active layer M30 of a third transistor M3, a second electrode plate 332, and a fourth active layer M40 of a fourth transistor M4 of a light emission detection circuit. The orthographic projection of the second electrode plate 332 on the substrate 10 overlaps with the orthographic projection of the first electrode plate 331 on the substrate 10. The orthographic projections of the first active layer M10, the second active layer M20 and the third active layer M30 on the substrate 10 overlaps the orthographic projection of the first electrode plate 331 on the substrate 10. In this way, the first plate 331 can shield the channel regions of the first transistor M1, the second transistor M2 and the third transistor M3 to prevent light from affecting the channel and prevent the channel from affecting the display effect due to photo-generated leakage.

In some exemplary embodiments, the second active layer M20, the third active layer M30, and the second plate 332 are an integral structure so that the drain electrode of the second transistor M2 and the drain electrode of the third transistor M3 are electrically connected through the conductive second plate 332. The orthographic projection of the fourth active layer M40 on the substrate 10 is within an orthographic projection range of the sensing light shield layer 41 on the substrate 10, so that the sensing light shield layer 41 can completely shield the fourth active layer M40 and ensure the performance of the fourth transistor M4.

(3) Forming a Gate Metal Layer.

In some exemplary embodiments, A second insulating film and a second metal film are sequentially deposited on the substrate 10 on which the aforementioned patterns are formed. The second insulating film and the second metal film are patterned through a patterning process to form a second insulating layer 12 (also referred to as a gate insulating layer) and a gate metal layer disposed on the second insulating layer 12, as shown in FIG. 13C. The gate metal layer may include a control electrode M13 of the first transistor M1, a control electrode M23 of the second transistor M2, a control electrode M33 of the third transistor M3, a control electrode M43 of the fourth transistor M4, a compensation connection line 34, a first scan line G1, a second scan line G2, and a reference voltage line V0. The compensation connection line 34, the first scan line G1, the second scan line G2, and the reference voltage line V0 all extend in the first direction X. The control electrode M13 of the first transistor M1, the control electrode M33 of the third transistor M3, and the first scan line G1 may form an integrated structure. The control electrode M43 of the fourth transistor M4 and the second scan line G2 may form an integrated structure.

(4) Forming a Third Insulating Layer.

In some exemplary embodiments, a third insulating film is deposited on the substrate 10 on which the aforementioned patterns are formed. The third insulating film is patterned through a patterning process to form a third insulating layer 13 (also referred to as an interlayer insulating layer) covering the aforementioned pattern, as shown in FIG. 13D. The third insulating layer 13 is provided with a plurality of via patterns. The plurality of via patterns may include a first via V1 to a nineteenth via V19. The third insulating layers 13 in the first via V1 to the sixth via V6 are removed, exposing the surface of the semiconductor layer. The seventh via V7 is a transfer via, and the transfer via is formed by two half-holes. One half hole is formed on the third active layer M30, the other half hole is formed on the compensation connection line 34. The third insulating layers 13 in the two half-holes are etched away, so that the transfer via formed by the two half-holes exposes the surface of the third active layer M30 and the surface of the compensation connection line 34 at the same time. The third insulating layers 13 in the eighth via V8 to the fourteenth via V14 are removed to expose the surface of the gate metal layer. The third insulating layer 13 and the first insulating layer 11 in the fifteenth via V15 through nineteenth via V19 are removed and the surface of the shield layer is exposed.

(5) Forming a First Source-Drain Metal Layer.

In some exemplary embodiments, a third metal film is deposited on the substrate 10 on which the aforementioned patterns are formed. The third metal film is patterned through a patterning process, and a first source-drain metal layer is formed on the third insulating layer 13, as shown in FIG. 13E. The first source-drain metal layer at least includes a plurality of data lines DL, a first power supply line VDD, a compensation line Se1, a sensing line Se2, a first electrode M21 of the second transistor M2, a second electrode M32 of the third transistor, a third electrode plate 333, a second electrode M42 of the fourth transistor, a first scan connection electrode 35, a second scan connection electrode 36, a fourth electrode plate 431, a fifth electrode plate 432, and a first connection electrode 44.

In some examples, the data line DL is electrically connected to a first doped region of the first active layer M10 of the first transistor M1 through a first via V1, and is also electrically connected to the data connection line 32 through an eighteenth via V18. The compensation line Se1 is connected to the compensation connection line 34 through an eighth via V8 and a seventh via V7, and is also electrically connected to the first doped region of the third active layer M30 of the third transistor M3 through the seventh via V7. One compensation line Se1 may be electrically connected to the pixel circuits of the eight light emitting units through the compensation connection line 34. The first power supply line VDD is electrically connected to the first power adapter line 31 through a sixteenth via V16. The second electrode M32 of the third transistor M3 is electrically connected to the second doped region of the third active layer M30 through the third via V3. The first electrode M21 of the second transistor M2 is electrically connected to the first doped region of the second active layer M20 through the fourth via V4, and is also electrically connected to the first power adapter line 31 through the seventh via V7. The second electrode M42 of the fourth transistor M4 is electrically connected to the second doped region of the fourth active layer M40 through the fifth via V5. The sensing line Se2 is electrically connected to the first doped region of the fourth active layer M40 through the sixth via V6. The third electrode plate 333 is electrically connected to a second doped region of the first active layer M10 of the first transistor M1 through a second via V2, is electrically connected to a control electrode M23 of the second transistor M2 through a tenth via V10, and is electrically connected to the first electrode plate 331 through a fifteenth via V15. In this example, the first electrode plate 331 and the third electrode plate 333 are electrically connected and served as the second electrode of the first storage capacitor C1, and the second electrode plate 332 is served as the first electrode of the first storage capacitor C1.

In some examples, the first scan connection electrode 35 is electrically connected to the first scan line G1 through the ninth via V9. The second scan connection electrode 36 is electrically connected to the sensing shield layer 41 through a nineteenth via V19, and is also electrically connected to the second scan line G2 through an eleventh via V11. The fourth electrode plate 431 is electrically connected to the reference voltage line V0 through a twelfth via V12. The fifth electrode plate 432 is electrically connected to the reference voltage line V0 through a fourteenth via V14. The first connecting electrode 44 is electrically connected to the reference voltage line V0 through a thirteenth via V13. The fourth electrode plate 431 and the fifth electrode plate 432 may serve as second electrodes of the second storage capacitor.

(6) Forming an Organic Hydrogen Barrier Layer.

In some exemplary embodiments, a fourth insulating film is deposited on the substrate 10 on which the aforementioned pattern is formed to form a third passivation layer 17; subsequently, an organic film is coated and patterned through a patterning process to form an organic hydrogen barrier layer 19 as shown in FIG. 13F. The orthographic projection of the organic hydrogen barrier layer 19 on the substrate 10 covers an orthographic projection of the fourth transistor on the substrate. The orthographic projection of the organic hydrogen barrier layer 19 on the substrate 10 may be rectangular. However, this embodiment is not limited thereto.

(7) Forming a Fourth Passivation Layer.

In some exemplary embodiments, a fifth insulating film is deposited on the substrate 10 on which the aforementioned patterns are formed, and the fifth insulating film is patterned through a patterning process to form a fourth passivation layer 18, as shown in FIG. 13G. The fourth passivation layer 18 is provided with a plurality of vias, and the plurality of vias may include a twenty-first via V21, a twenty-second via V22, and a twenty-third via V23. The fourth passivation layer 18 and the third passivation layer 17 in the twenty-first V21 through twenty-third via V23 are removed to expose the surface of the first source-drain metal layer.

(8) Forming a Second Source-Drain Metal Layer and a First Cathode of the Optical Sensing Element.

In some exemplary embodiments, a fourth metal film is deposited on the substrate 10 on which the aforementioned pattern is formed, the fourth metal film is patterned through a patterning process, and a second source-drain metal layer and a first cathode 231 of the optical sensing element are formed on the fourth passivation layer 18, as shown in FIG. 13H. The second source-drain metal layer includes: a second connection electrode 45 and a third connection electrode 37. The second connection electrode 45 is electrically connected to the first connection electrode 44 through the twenty-third via V23, that is, electrically connected to the reference voltage line V0. The third connection electrode 37 is electrically connected to the second electrode M32 of the third transistor M3 through the twenty-first via V21. The first cathode 231 of the optical sensing element is electrically connected to the second electrode M42 of the fourth transistor M4 through the twenty-second via V22. An orthographic projection of the first cathode 231 of the optical sensing element on the substrate 10 overlaps with the orthographic projections of the fourth electrode plate 431 and fifth electrode plate 432 on the substrate 10. In this example, the first cathode 231 of the optical sensing element simultaneously serves as the first electrode of the second storage capacitor C2 and the fourth electrode plate 431 and fifth electrode plate 432 serve as the second electrodes of the second storage capacitor C2.

(9) Forming a Photoelectric Conversion Structure.

In some exemplary embodiments, a PIN film is deposited on the substrate 10 on which the aforementioned pattern is formed, and the PIN film is patterned through a patterning process to form a photoelectric conversion structure, as shown in FIG. 13I. The photoelectric conversion structure may include a first photoelectric conversion structure 232a and a second photoelectric conversion structure 232b arranged in sequence along a first direction X. The orthographic projection of the photoelectric conversion structure on the substrate 10 and the orthographic projection of the transistor of the light emission detection circuit (e.g. the fourth transistor) on the substrate 10 may not overlap. An orthographic projection of a transistor (e.g. a fourth transistor) of the light emission detection circuit on the substrate 10 is located between an orthographic projections of the first photoelectric conversion structure 232a and the second photoelectric conversion structure 232b on the substrate 10.

Figure 14:
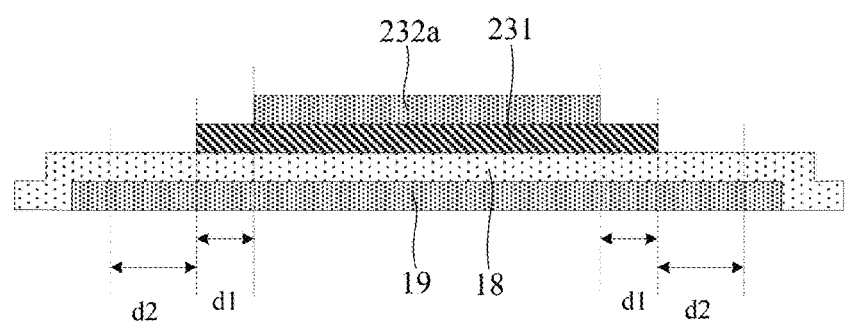
FIG. 14 is a partial schematic sectional view along an R-R' direction in FIG. 13I.

In some exemplary embodiments, as shown in FIG. 14, in the second direction Y, a first distance d1 is arranged between an edge of the first photoelectric conversion structure 232a and the same side edge of the first cathode 231; and a second distance d2 is arranged between an edge of the first cathode 231 and the same side edge of the organic hydrogen barrier layer 19. The distance between an edge of the first photoelectric conversion structure 232a and the same side edge of the organic hydrogen barrier layer 19 is the sum of the first distance d1 and the second distance d2. For example, the first distance d1 may be 2 um, and the second distance d2 may be 3 um. However, this embodiment is not limited thereto.

In this example, by providing the fourth passivation layer 18, over-etching of the organic hydrogen barrier layer 19 during dry etching of the photoelectric conversion structure can be avoided and the organic hydrogen barrier layer 19 can be protected. Because the organic hydrogen barrier layer 19 releases gas in the subsequent high temperature, sufficient outgassing space can be reserved for the organic hydrogen barrier layer 19 by setting the second distance D2 to avoid film explosion. By configuring the edge of the organic hydrogen barrier layer 19 in the second direction greater than the edge of the photoelectric conversion structure, the flatness of the region where the photoelectric conversion structure is located can be ensured.

(10) Forming a First Anode of the Optical Sensing Element.

In some exemplary embodiments, a first transparent conductive film is deposited on the substrate 10 in which the aforementioned pattern is formed, and the first transparent conductive film is patterned through a patterning process to form a first anode of the optical sensing element, as shown in FIG. 13J. The first anode of the optical sensing element may include a first sub-anode 233a and a second sub-anode 233b. The orthographic projections of the first sub-anode 233a and the second sub-anode 233b on the substrate may both be rectangular. In this example, the first sub-anode 233a, the first photoelectric conversion structure 232a and the first cathode 231 may form a first sub-optical sensing element, and the second sub-anode 233b, the second photoelectric conversion structure 232b and the first cathode 231 may form a second sub-optical sensing element. In this example, transistors are not provided below the first sub-optical sensing element and the second sub-optical sensing element, and there is no via design, so that the flatness of the area where the photoelectric conversion structure is located can be ensured.

(11) Forming a First Passivation Layer and a First Planarization Layer.

In some exemplary embodiments, a sixth insulating film is deposited on the substrate 10 on which the aforementioned pattern is formed, and the sixth insulating film is patterned through a patterning process to form the first passivation layer 14; subsequently a planarization film is coated and patterned through a patterning process to form a first planarization layer 15, as shown in FIG. 13K. The first planarization layer 15 is provided with a plurality of vias, and the plurality of vias may include, for example, a twenty-fifth via V25 to a twenty-eighth via V28. The first planarization layer 15 and the first passivation layer 14 in the twenty-sixth via V26 and the twenty-seventh via V27 are removed to expose the surface of the first anode of the optical sensing element. The first planarization layer 15 and the first passivation layer 14 in the twenty-fifth via V25 and the twenty-eighth via V28 are removed to expose the surface of the second source-drain metal layer.

(12) Forming a Light-Transmissive Layer and an Anode Connection Electrode of the Second Anode of the Light Emitting Element.

In some exemplary embodiments, a second transparent conductive film is deposited on the substrate 10 on which the foregoing pattern is formed, and the second transparent conductive film is patterned through a patterning process to form the anode connection electrode 234 of the optical sensing element and the light-transmissive layer 2411 of the second anode of the light emitting element, as shown in FIG. 13L. The light-transmissive layer 2411 of the second anode of the light emitting element is electrically connected to the third connection electrode 37 through the twenty-fifth via V25 so as to be electrically connected to the pixel circuit. The anode connection electrode 234 is electrically connected to the first sub-anode 233a through the twenty-sixth via V26, to the second sub-anode 233b through the twenty-seventh via V27, and to the second connection electrode 45 through the twenty-eighth via V28, thereby achieving an electrical connection to the reference voltage line V0. The orthographic projection of the anode connection electrode 234 on the substrate 10 may be T-shaped. However, this embodiment is not limited thereto.

In some exemplary embodiments, an orthographic projection of the light-transmissive layer 2411 of the second anode of the light emitting element on the substrate overlaps an orthographic projection of the optical sensing element on the substrate.

(13) Forming a Reflective Layer of a Second Anode of the Light Emitting Element.

In some exemplary embodiments, a conductive film is deposited on the substrate 10 on which the aforementioned pattern is formed, and the conductive film is patterned through a patterning process to form a reflective layer 2412 of the second anode of the light emitting element, as shown in FIG. 13M. The reflective layer 2412 of the second anode is in direct contact with the light-transmissive layer 2411, and an orthographic projection of the reflective layer 2412 on the substrate 10 overlaps with an orthographic projection of the light-transmissive layer 2411 on the substrate, and does not overlap with an orthographic projection of the optical sensing element on the substrate.

(14) Forming a Pixel Define Layer.

In some exemplary embodiments, a pixel define film is coated on the substrate 10 on which the aforementioned patterns are formed, and the pixel define film is patterned through a patterning process to form a pixel define layer 244. As shown in FIG. 13N, the pixel define layer 244 is provided with a plurality of pixel openings OP. The pixel define layer 244 in the pixel opening OP is removed to expose the surface of the part of the light-transmissive layer 2411 and the surface of the part of the reflective layer 2412 of the second anode. In a plane parallel to the display substrate, the shape of the pixel opening OP may be a polygon or other shape. In a direction perpendicular to the display substrate, the cross-sectional shape of the pixel opening OP may be a rectangle or a trapezoid, etc. However, this embodiment is not limited thereto.

In some exemplary embodiments, the pixel define layer 244 may be made of a material such as polyimide, acrylic, or polyethylene terephthalate.

(15) Forming an Organic Emitting Layer and a Second Cathode.

In some exemplary embodiments, an organic emitting layer is formed on the substrate 10 on which the aforementioned pattern is formed by evaporation or ink jet printing. The organic emitting layer of each light emitting unit can be contacted with the second anode through the pixel opening OP. Subsequently, a second cathode covering the organic emitting layer is formed by an evaporation process. The second cathodes of the plurality of light emitting elements may be an integral structure communicated together.

In some examples, the organic emitting layer may include: an Emitting Layer (EML) and at least one of the following: a Hole Injection Layer (HIL), a Hole Transport Layer (HTL), an Electron Block Layer (EBL), a Hole Block Layer (HBL), an Electron Transport Layer (ETL) and an Electron Injection Layer (EIL).

Hereto, the preparation of the light emitting structure layer is completed. After the preparation of the light emitting structure layer is completed, the encapsulation layer can be formed. The encapsulation layer may include a first encapsulation layer, second encapsulation layer, and third encapsulation layer which are stacked. The first encapsulation layer and the third encapsulation layer may be made of an inorganic material, and the second encapsulation layer may be made of an organic material. The second encapsulation layer may be located between the first encapsulation layer and the third encapsulation layer. Adopting stacked structure of inorganic, organic and inorganic can ensure that external water vapor cannot enter the emitting structure layer.

In the present exemplary embodiment, orthographic projections of the first light conversion structure and the second light conversion structure are rectangular, and the orthographic projections of the first light conversion structure and the second light conversion structure on the substrate and an orthographic projection of the transistor of the light emission detection circuit on the substrate do not overlap. In this way, the influence of dark current on the optical sensing element can be reduced, thereby improving the sensing effect.

In some exemplary embodiments, as shown in FIG. 12, the orthographic projection of the first sub-optical sensing element on the substrate overlaps the second light emitting region 200 of the four light emitting units (e.g., the first light emitting unit P1, the second light emitting unit P2, the fifth light emitting unit P5, and the sixth light emitting unit P6), and the orthographic projection of the second sub-optical sensing element on the substrate overlaps with the second light emitting region 200 of the four light emitting units (for example, the third light emitting unit P3, the fourth light emitting unit P4, the seventh light emitting unit P7, and the eighth light emitting unit P8). The orthographic projection of an optical sensing element on the substrate overlaps the second light emitting region of the eight light emitting units, and the overlapping area may be about 1300 um$^2$, for example, so that the space utilization rate can be improved.

In some exemplary embodiments, the shield layer, the gate metal layer, the first source-drain metal layer, the second source-drain metal layer, and the first cathode of the optical sensing element may be made of metal materials, such as any one or more of argentum (Ag), copper (Cu), aluminum (Al) and molybdenum (Mo), or alloy materials of the above metals, such as Aluminum neodymium (AlNd) alloy or Molybdenum Niobium (MoNb) alloy, and may have a single-layer structure or a multi-layer composite structure, such as Mo/Cu/Mo. For example, the shield layer may be metal Mo, and the gate metal layer, the first source-drain metal layer, the second source-drain metal layer, and the first cathode may all be a multi-layer composite structure of Mo/Al/Mo or Mo/Cu/Mo. The first insulating layer 11, the second insulating layer 12, and the third insulating layer 13 may be any one or more of silicon oxide (SiOx), silicon nitride (SiNx), and silicon oxynitride (SiON), and may be in a single layer, a plurality of layers, or a composite layer.

In some exemplary embodiments, the semiconductor layer may be made of oxides containing indium and tin, oxides containing tungsten and indium, oxides containing tungsten, indium and zinc, oxides containing titanium and indium, oxides containing titanium, indium and tin, oxides containing indium and zinc, oxides containing silicon, indium and tin, or oxides containing indium, gallium and zinc, etc. The metal oxide layer may be a single layer, or double layers, or a plurality of layers. For example, the material of the semiconductor layer may be IGZO.

In some exemplary embodiments, the thickness of the shield layer may be about 2,000 Å to 4,000 Å, the thickness of the gate metal layer may be about 3,500 Å to 5,000 Å, the thickness of the first source-drain metal layer may be about 3,500 Å to 5,000 Å, and the thickness of the second source-drain metal layer may be about 3,500 Å to 5,000 Å. The thickness of the semiconductor layer can be about 300 Å to 600 Å. The thickness of the first insulating layer and the second insulating layer may be about 1000 Å to 3000 Å. The thickness of the third insulating layer may be about 4000 Å to 5000 Å. The thickness of the third passivation layer may be about 3000 Å to 5000 Å. The thickness of the fourth passivation layer may be about 1000 Å to 3000 Å. The thickness of the organic hydrogen barrier layer may be about 1 um to 3 um. The thickness of the first planarization layer may be about 1 um to 2 um. The thickness of the first passivation layer may be about 2000 Å to 4000 Å. The thickness of the photoelectric conversion structure may be about 1 um. The thickness of the first anode may be about 500 Å to 1000 Å. The thickness of the light-transmissive layer may be about 500 Å to 1000 Å. The thickness of the pixel define layer may be about 1 um to 2 um.

As can be seen from the structure and preparation process of the display substrate provided by the embodiment of the present disclosure, the embodiment of the present invention can reduce hydrogen element permeation into the active layer of the transistor by arranging the inorganic hydrogen resisting layer and the organic hydrogen resisting layer, thereby effectively ensuring the electrical stability of the transistor, effectively ensuring the uniformity of the electrical characteristics of the transistor, thereby improving the yield and the display effect. The preparation condition of the inorganic hydrogen barrier layer according to this embodiment may refer to the descriptions in the above-mentioned embodiments, and thus will not be repeated herein.

The structure (or method) shown in this embodiment may be combined with structures (or methods) shown in other embodiments as appropriate.

Figure 15:
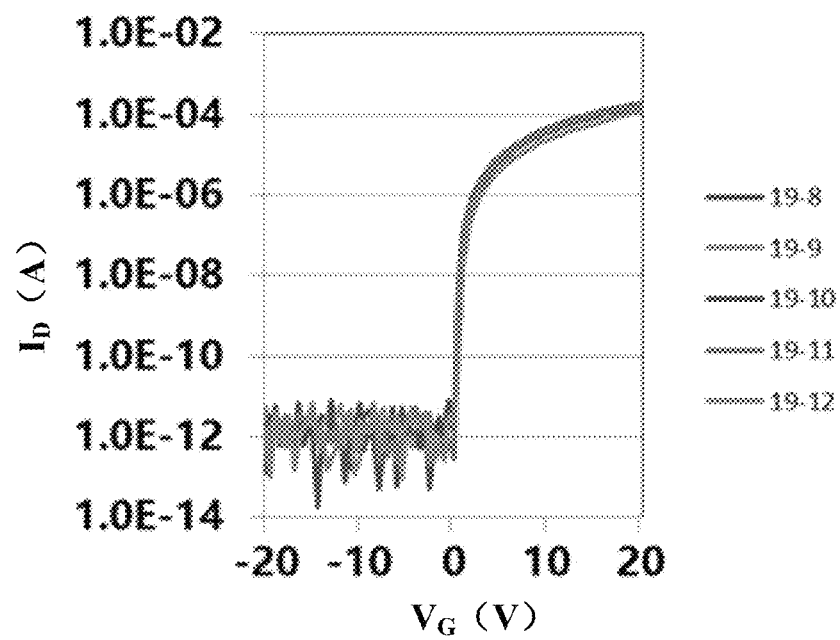
FIG. 15 is an electrical characteristic diagram of a transistor of a pixel circuit in a display substrate according to at least one embodiment of the present disclosure.
Figure 16:
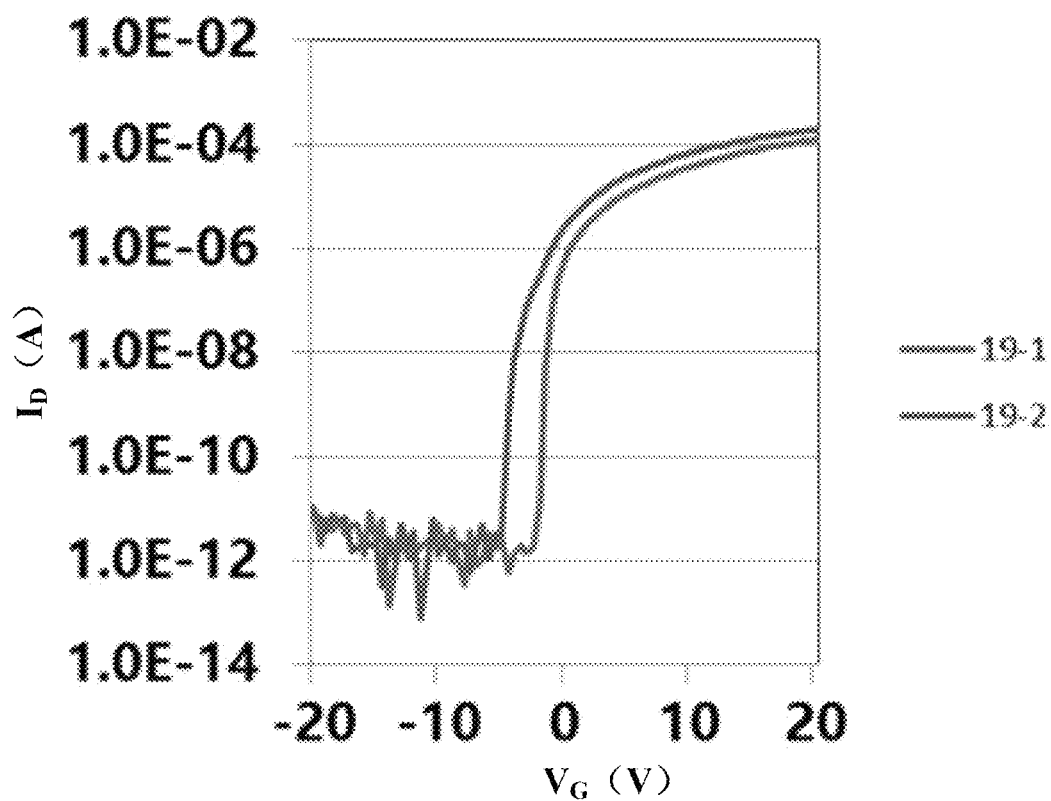
FIG. 16 is an electrical characteristic diagram of a transistor of a light emission detection circuit in a display substrate according to at least one embodiment of the present disclosure.
Figure 17:
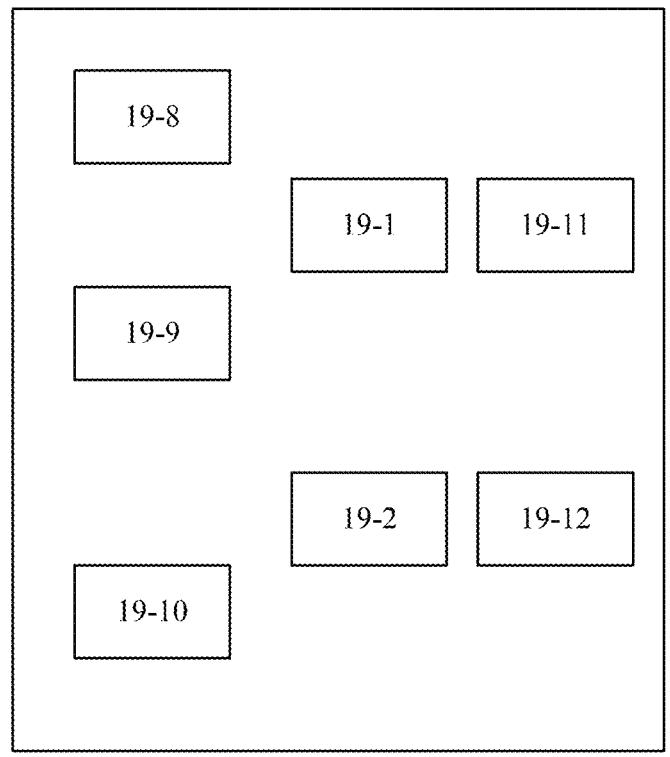
FIG. 17 is a schematic diagram of a test position of a display substrate according to at least one embodiment of the disclosure.

FIG. 15 is an electrical characteristic diagram of a transistor of a pixel circuit in a display substrate according to at least one embodiment of the present disclosure. FIG. 16 is an electrical characteristic diagram of a transistor of a light emission detection circuit in a display substrate according to at least one embodiment of the present disclosure. FIGS. 15 and 16 each schematically show electrical characteristics of transistors of a plurality of test locations on a substrate. FIG. 17 is a schematic diagram of test positions of a display substrate according to at least one embodiment of the disclosure.

In some exemplary embodiments, as shown in FIG. 15, the aspect ratio (W/L) of the transistors of the pixel circuit is each about 15/6 and the data voltage Vd is about 15.1 V. According to the curves of drain current Ip and gate voltage VG of the transistor of the pixel circuit shown in FIG. 15, the display substrate provided in this embodiment can effectively avoid the influence of hydrogen environment for preparing the optical sensing element on the TFT device, and can ensure the electrical performance of the TFT device.

In some exemplary embodiments, as shown in FIG. 16, the aspect ratio of the transistor of the light emission detection circuit is about 10.5/6 and the data voltage Vd is about 15.1 V. As can be seen from the curves of drain current Ip and gate voltage VG of the transistor of the light emission detection circuit shown in FIG. 16, the electrical performance of the TFT device can still be guaranteed after the optical sensing element of the display substrate provided in this embodiment is connected to the transistor of the light emission detection circuit.

Figure 18:
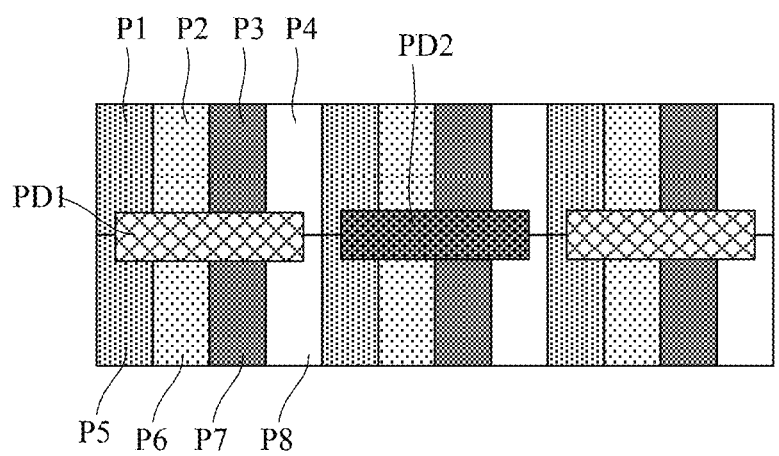
FIG. 18 is a schematic diagram of another arrangement of a light emitting unit and a light detection unit according to at least one embodiment of the present disclosure.

FIG. 18 is a schematic diagram of another arrangement of a light emitting unit and a light detection unit according to at least one embodiment of the present disclosure. In some exemplary embodiments, as shown in FIG. 18, the display substrate includes a plurality of pixel units arranged regularly. A pixel unit includes four light emitting units emitting light rays of different colors. The display substrate also includes a first light detection unit PD1 and a second light detection unit PD2. Each light detection unit overlaps with the orthographic projections of the second light emitting regions of the eight light emitting units on the substrate. The second light detection unit PD2, as a test light detection unit, is configured to test whether the light detection unit is normal or not, and the first light detection unit PD1, as a officially used light detection unit, is configured to detect the brightness of the light emitting unit.

For the description of other structures of the display substrate of this embodiment, reference may be made to the description of the aforementioned embodiments, so it will not be repeated here.

Figure 19:
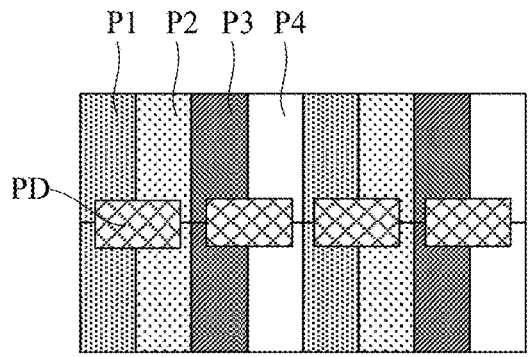
FIG. 19 is a schematic diagram of another arrangement of a light emitting unit and a light detection unit according to at least one embodiment of the present disclosure.

FIG. 19 is a schematic diagram of another arrangement of a light emitting unit and a light detection unit according to at least one embodiment of the present disclosure. In some exemplary embodiments, as shown in FIG. 19, the display substrate includes a plurality of pixel units arranged regularly. A pixel unit includes four light emitting units (e.g. first light emitting units P1 to fourth light emitting units P4) emitting light rays of different colors. The pixel unit includes four light emitting units which can be arranged in a horizontal parallel manner, and the light emitting units which emit light of the same color are located in the same column. The four light emitting units arranged in an array (i.e., the four light emitting units arranged in a 2*2 arrangement) can be multiplexed with one light detection unit PD. An orthographic projection of the optical sensing element of the light detection unit PD on the substrate is overlapped with an orthographic projection of the second light emitting region of the light emitting elements of the eight light emitting units on the substrate.

For the description of other structures of the display substrate of this embodiment, reference may be made to the description of the aforementioned embodiments, so it will not be repeated here.

Figure 20:
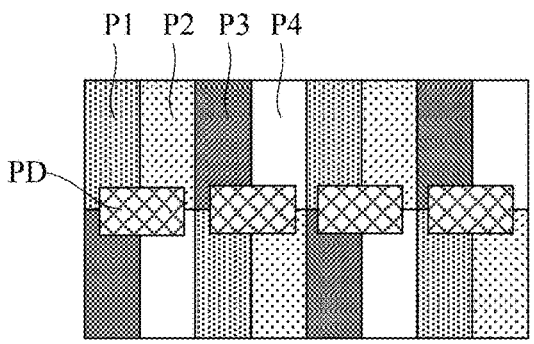
FIG. 20 is a schematic diagram of another arrangement of a light emitting unit and a light detection unit according to at least one embodiment of the present disclosure.

FIG. 20 is a schematic diagram of another arrangement of a light emitting unit and a light detection unit according to at least one embodiment of the present disclosure. In some exemplary embodiments, as shown in FIG. 20, the display substrate includes a plurality of pixel units arranged regularly. A pixel unit includes four light emitting units (e.g. first light emitting units P1 to fourth light emitting units P4) emitting light rays of different colors. The pixel unit includes four light emitting units which can be arranged in a horizontal parallel manner, and the light emitting units which emit light of the same color are not located in the same column. The four light emitting units arranged in an array (i.e., the four light emitting units arranged in a 2*2 arrangement) can be multiplexed with one light detection unit PD. An orthographic projection of the optical sensing element of the light detection unit PD on the substrate is overlapped with an orthographic projection of the second light emitting region of the light emitting elements of the eight light emitting units on the substrate.

For the description of other structures of the display substrate of this embodiment, reference may be made to the description of the aforementioned embodiments, so it will not be repeated here.

Figure 21:
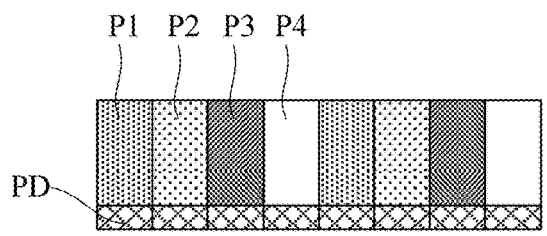
FIG. 21 is a schematic diagram of another arrangement of a light emitting unit and a light detection unit according to at least one embodiment of the present disclosure.

FIG. 21 is a schematic diagram of another arrangement of a light emitting unit and a light detection unit according to at least one embodiment of the present disclosure. In some exemplary embodiments, as shown in FIG. 21, the display substrate includes a plurality of pixel units arranged regularly. A pixel unit includes four light emitting units (e.g. first light emitting units P1 to fourth light emitting units P4) emitting light rays of different colors. The pixel unit includes four light emitting units which can be arranged in a horizontal parallel manner. The light detection unit PD and the light emitting unit may correspond one to one. An orthographic projection of the optical sensing element of a light detection unit PD on the substrate is overlapped with an orthographic projection of the second light emitting region of the light emitting elements of a light emitting unit on the substrate.

For the description of other structures of the display substrate of this embodiment, reference may be made to the description of the aforementioned embodiments, so it will not be repeated here.

At least one embodiment of the present disclosure further provides a method for preparing a display substrate, which includes forming a circuit structure layer and at least one inorganic hydrogen barrier layer on a substrate, wherein the circuit structure layer at least includes a pixel circuit of a light emitting unit and a light emission detection circuit of a light detection unit; forming an optical sensing element of a light detection unit on a side of the circuit structure layer away from the substrate; and forming a light emitting element of the light emitting unit on a side of the optical sensing element away from the substrate. The light emitting element has a first light emitting region and a second light emitting region, the first light emitting region of the light emitting element emit light from a side away from the substrate, and the second light emitting region of the light emitting element emit light from a side close to the substrate; an orthographic projection of the first light emitting region of the light emitting element on the substrate includes an orthographic projection of the second light emitting region on the substrate, and an orthographic projection of at least one optical sensing element on the substrate at least partially overlaps an orthographic projection of the second light emitting region of the at least one light emitting element on the substrate.

In some exemplary embodiments, the circuit structure layer includes: a semiconductor layer, a gate metal layer, and a first source-drain metal layer sequentially disposed on the substrate. The first cathode of the optical sensing element and the first source-drain metal layer are in the same layer structure. The inorganic hydrogen barrier layer at least includes one of the following: an interlayer insulating layer located between the gate metal layer and the first source-drain metal layer, and a second passivation layer located on a side of the first source-drain metal layer away from the substrate. Alternatively, the first cathode of the optical sensing element is located on a side of the first source-drain metal layer away from the substrate. The inorganic hydrogen barrier layer at least includes one of the following: an interlayer insulating layer between the gate metal layer and the first source-drain metal layer, a third passivation layer between the first source-drain metal layer and the first cathode of the optical sensing element, and a fourth passivation layer between the third passivation layer and the first cathode of the optical sensing element.

In some exemplary embodiments, the forming of at least one inorganic hydrogen barrier layer on the substrate includes: forming a second passivation layer by deposition, wherein the second passivation layer includes a stacked first inorganic layer and a second inorganic layer. The deposition mode of the first inorganic layer satisfies the following conditions: the deposition power is 500 watts to 1000 watts; the deposition pressure is 1000 mTorr to 2000 mTorr; and the gas flow ratio of SiH to N2O is from 1:30 to 1:50. The deposition mode of the second inorganic layer satisfies the following conditions: the deposition power is 1000 watts to 2000 watts; the deposition pressure is 1000 mTorr to 2000 mTorr; and the gas flow ratio of SiH to $N_2O$ is from 1:30 to 1:50.

In some exemplary embodiments, forming at least one inorganic hydrogen barrier layer on a substrate includes forming a third passivation layer by deposition. The deposition mode of the third passivation layer satisfies the following conditions: the deposition power is 500 watts to 1000 watts; the deposition pressure is 1000 mTorr to 2000 mTorr; and the gas flow ratio of SiH to $N_2O$ is from 1:30 to 1:50.

For the preparation process of the display substrate according to this embodiment, reference may be made to descriptions of the aforementioned embodiments, and thus will not be repeated here.

Figure 22:
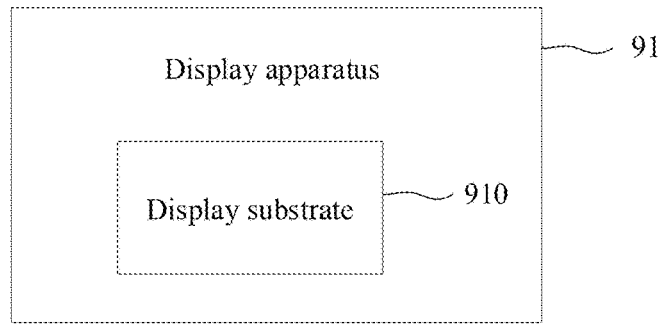
FIG. 22 is a schematic diagram of a display apparatus according to at least one embodiment of the present disclosure.

FIG. 22 is a schematic diagram of a display apparatus according to at least one embodiment of the present disclosure. As shown in FIG. 22, the embodiment provides a display apparatus 900, which includes a display substrate 910. The display substrate 910 is the display substrate provided in the above-mentioned embodiments. In some examples, the display substrate 910 may be an OLED display substrate. The display apparatus 900 may be any product or component with a display function, such as an OLED display apparatus, a cell phone, a tablet computer, a television, a display, a laptop computer, a digital photo frame, a navigator, a vehicle-mounted display, a watch, and a wristband. However, this embodiment is not limited thereto.

In the description of embodiments of the present disclosure, orientation or positional relationships indicated by terms "middle", "upper", "lower", "front", "back", "vertical", "horizontal", "top", "bottom", "inside", "outside" and the like are based on the orientation or positional relationships shown in the drawings, and are for the purpose of ease of description of the present disclosure and simplification of the description only, but are not intended to indicate or imply that the referred device or element must have a specific orientation, or be constructed and operated in a particular orientation, and therefore they should not be construed as limitations on the present disclosure.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising:
   a substrate and a plurality of light emitting units and a plurality of light detection units located on the substrate, wherein at least one light emitting unit in the plurality of light emitting units comprises: a light emitting element and a pixel circuit connected to the light emitting element, at least one light detection unit in the plurality of light detection units comprises: an optical sensing element and a light emission detection circuit connected to the optical sensing element;
   the optical sensing element is located on a side of the light emitting element close to the substrate; at least one inorganic hydrogen barrier layer is arranged on a side of the optical sensing element close to the substrate;
   the light emitting element comprises a first light emitting region and a second light emitting region, the first light emitting region of the light emitting element emitting light from a side away from the substrate, and the second light emitting region of the light emitting element emitting light from a side close to the substrate; an orthographic projection of the second light emitting region of the light emitting element on the substrate is completely fallen within an orthographic projection of the first light emitting region on the substrate; and
   an orthographic projection of at least one of the optical sensing elements on the substrate is at least partially overlapped with an orthographic projection of a second light emitting region of at least one of the light emitting elements on the substrate.

2. The display substrate of claim 1, wherein the optical sensing element comprises: a first cathode, a photoelectric conversion structure and a first anode that are sequentially stacked along a direction away from the substrate; the first anode is made of a light-transmissive material; and
   the at least one inorganic hydrogen barrier layer is located on a side of the photoelectric conversion structure close to the substrate.

3. The display substrate of claim 2, wherein in a direction perpendicular to the display substrate, the light emission detection circuit at least comprises: a semiconductor layer, a gate metal layer, and a first source-drain metal layer sequentially disposed on the substrate;
   the first cathode of the optical sensing element and the first source-drain metal layer are in a same layer;
   the inorganic hydrogen barrier layer at least comprises one of the following: an interlayer insulating layer located between the gate metal layer and the first source-drain metal layer, and a second passivation layer located on a side of the first source-drain metal layer away from the substrate.

4. The display substrate of claim 3, wherein an orthographic projection of the second passivation layer on the substrate is not overlapped with an orthographic projection of the photoelectric conversion structure on the substrate.

5. The display substrate of claim 3, wherein the second passivation layer comprises a first inorganic layer and a second inorganic layer that are stacked, and thicknesses of the first inorganic layer and the second inorganic layer are substantially the same.

6. The display substrate of claim 5, wherein the thicknesses of the first inorganic layer and the second inorganic layer are 1000 angstroms to 3000 angstroms, and the material of the first inorganic layer and the second inorganic layer is silicon oxide.

7. The display substrate of claim 2, wherein in a direction perpendicular to the display substrate, the light emission detection circuit at least comprises: a semiconductor layer, a gate metal layer, and a first source-drain metal layer sequentially disposed on the substrate;
   the first cathode of the optical sensing element is located on a side of the first source-drain metal layer away from the substrate;
   the inorganic hydrogen barrier layer at least comprises one of the following: an interlayer insulating layer between the gate metal layer and the first source-drain metal layer, a third passivation layer between the first source-drain metal layer and the first cathode of the optical sensing element, and a fourth passivation layer between the third passivation layer and the first cathode of the optical sensing element.

8. The display substrate of claim 7, wherein a material of the third passivation layer and the fourth passivation layer is silicon oxide, and a thickness of the third passivation layer and the fourth passivation layer is 1000 angstroms to 3000 angstroms.

9. The display substrate of claim 7, wherein an organic hydrogen barrier layer is provided between the fourth passivation layer and the first cathode of the optical sensing element;
   an orthographic projection of the organic hydrogen barrier layer on the substrate covers an orthographic projection of the photoelectric conversion structure of the optical sensing element on the substrate;
   the organic hydrogen barrier layer satisfies at least one of the following:
   a curing temperature is lower than 230 degrees Celsius; and
   a thermal decomposition temperature is greater than 450 degrees Celsius.

10. The display substrate of claim 3, wherein an etching rate of the interlayer insulating layer is 2 Å/s.

11. The display substrate of claim 2, wherein the light emission detection circuit at least comprises one transistor;
    an orthographic projection of the photoelectric conversion structure on the substrate is not overlapped with an orthographic projection of the transistor of the light emission detection circuit on the substrate.

12. The display substrate of claim 11, wherein the photoelectric conversion structure comprises a first photoelectric conversion structure and a second photoelectric conversion structure arranged in sequence along a first direction, and the orthographic projection of the transistor of the light emission detection circuit on the substrate is located between an orthographic projection of the first photoelectric conversion structure and an orthographic projection of the second photoelectric conversion structure on the substrate.

13. The display substrate of claim 12, wherein the orthographic projections of the first photoelectric conversion structure and the second photoelectric conversion structure on the substrate are rectangular.

14. The display substrate of claim 1, wherein the light emitting element comprises: a second anode, an emitting functional layer, and a second cathode that are sequentially stacked in a direction away from the substrate; the second cathode is made of a light-transmissive material, and the second anode comprises a reflective layer and a light-transmissive layer which are stacked; an orthographic projection of the reflective layer on the substrate is not overlapped with the orthographic projection of the second light emitting region on the substrate, and an orthographic projection of the light-transmissive layer on the substrate covers the orthographic projection of the second light emitting region on the substrate.

15. The display substrate of claim 1, wherein the orthographic projection of the optical sensing element on the substrate is at least partially overlapped with an orthographic projection of the light emission detection circuit on the substrate, and the orthographic projection of the optical sensing element on the substrate is not overlapped with an orthographic projection of the pixel circuit on the substrate.

16. The display substrate of claim 1, wherein the orthographic projection of at least one optical sensing element on the substrate is at least partially overlapped with orthographic projections of second light emitting regions of eight light emitting elements on the substrate.

17. A display apparatus, comprising the display substrate of claim 1.

18. A preparation method for a display substrate, comprising:
 forming a circuit structure layer and at least one inorganic hydrogen barrier layer on a substrate, wherein the circuit structure layer at least comprises a pixel circuit of a light emitting unit and a light emission detection circuit of a light detection unit;
 forming an optical sensing element of the light detection unit on a side of the circuit structure layer away from the substrate; and
 forming a light emitting element of the light emitting unit on a side of the optical sensing element away from the substrate,
 wherein the light emitting element comprises a first light emitting region and a second light emitting region, the first light emitting region of the light emitting element emitting light from a side away from the substrate, and the second light emitting region of the light emitting element emitting light from a side close to the substrate; an orthographic projection of the first light emitting region of the light emitting element on the substrate comprises an orthographic projection of the second light emitting region on the substrate, and an orthographic projection of at least one optical sensing element on the substrate is at least partially overlapped with an orthographic projection of the second light emitting region of at least one light emitting element on the substrate.

19. The preparation method of claim 18, wherein the circuit structure layer comprises: a semiconductor layer, a gate metal layer, and a first source-drain metal layer sequentially disposed on the substrate;
 a first cathode of the optical sensing element and the first source-drain metal layer are in a same layer; the inorganic hydrogen barrier layer at least comprises one of the following: an interlayer insulating layer located between the gate metal layer and the first source-drain metal layer, and a second passivation layer located on a side of the first source-drain metal layer away from the substrate; or
 the first cathode of the optical sensing element is located on a side of the first source-drain metal layer away from the substrate; the inorganic hydrogen barrier layer at least comprises one of the following: an interlayer insulating layer between the gate metal layer and the first source-drain metal layer, a third passivation layer between the first source-drain metal layer and the first cathode of the optical sensing element, and a fourth passivation layer between the third passivation layer and the first cathode of the optical sensing element.

20. The preparation method of claim 19, wherein forming at least one inorganic hydrogen barrier layer on the substrate comprises:
 forming a second passivation layer by deposition, wherein the second passivation layer comprises a first inorganic layer and a second inorganic layer which are stacked; a deposition mode of the first inorganic layer satisfies following conditions: a deposition power is 500 watts to 1000 watts; a deposition pressure is 1000 mTorr to 2000 mTorr; and a gas flow ratio of SiH to $N_2O$ is 1:30 to 1:50; and
 a deposition mode of the second inorganic layer satisfies following conditions: a deposition power is 1000 watts to 2000 watts; a deposition pressure is 1000 mTorr to 2000 m Torr; and a gas flow ratio of SiH to $N_2O$ is 1:30 to 1:50;
 wherein forming at least one inorganic hydrogen barrier layer on the substrate comprises:
 forming a third passivation layer by deposition; a deposition mode of the third passivation layer satisfies following conditions: a deposition power is 500 watts to 1000 watts; a deposition pressure is 1000 mTorr to 2000 mTorr; and a gas flow ratio of SiH to $N_2O$ is 1:30 to 1:50.

\* \* \* \* \*